(12) United States Patent
O'Shaughnessy et al.

(10) Patent No.: US 6,921,579 B2
(45) Date of Patent: Jul. 26, 2005

(54) TEMPORARY PROTECTIVE COVERS

(75) Inventors: Roger D. O'Shaughnessy, Eden Prairie, MN (US); Annette J. Krisko, Prairie de Sac, WI (US); Klaus Hartig, Avcoa, WI (US)

(73) Assignee: Cardinal CG Company, Eden Prairie, MN (US)

( * ) Notice: Subject to any disclaimer, the term of this patent is extended or adjusted under 35 U.S.C. 154(b) by 0 days.

(21) Appl. No.: 10/009,291

(22) PCT Filed: Sep. 11, 2001

(86) PCT No.: PCT/US01/28577

§ 371 (c)(1),
(2), (4) Date: Jun. 17, 2002

(87) PCT Pub. No.: WO02/22516

PCT Pub. Date: Mar. 21, 2002

(65) Prior Publication Data

US 2003/0059623 A1 Mar. 27, 2003

Related U.S. Application Data

(60) Provisional application No. 60/231,895, filed on Sep. 11, 2000.

(51) Int. Cl.[7] .................................................. B32B 9/00
(52) U.S. Cl. ........................ 428/432; 428/426; 428/701; 428/702; 428/699
(58) Field of Search ..................... 428/426, 432, 428/701, 702, 699, 41.7

(56) References Cited

U.S. PATENT DOCUMENTS

| | | | |
|---|---|---|---|
| 1,256,818 A | 2/1918 | Nile | |
| 2,780,553 A | 2/1957 | Pawlyk | 106/1 |
| 3,852,098 A | 12/1974 | Bloss et al. | |
| 3,925,182 A | 12/1975 | Carmichael et al. | 204/192 |
| 3,970,037 A | 7/1976 | Sopko | 118/48 |

(Continued)

FOREIGN PATENT DOCUMENTS

| | | | |
|---|---|---|---|
| DE | 43 13 284 | 10/1994 | |
| EP | 0 637 572 | 8/1994 | |
| EP | 0 689 096 | 6/1995 | ........... G03F/7/038 |
| EP | 0 820 967 A1 | 7/1997 | |
| JP | 57-140339 | 8/1982 | |
| JP | 61-91042 | 5/1986 | |
| JP | 64-14129 | 1/1989 | |
| WO | WO 97/15499 | 5/1997 | ........... B65B/33/00 |
| WO | WO 97/37946 | 10/1997 | |
| WO | WO 00/37377 | 2/1999 | |
| WO | WO 00/37376 | 8/1999 | |
| WO | WO 00/50354 | 8/2000 | |
| WO | WO 01/02496 | 1/2001 | ............ C09D/5/00 |

*Primary Examiner*—Deborah Jones
*Assistant Examiner*—G. Blackwell-Rudasill
(74) *Attorney, Agent, or Firm*—Fredrikson & Byron, P.A.

(57) ABSTRACT

A substrate carrying a temporary protective cover and related methods of producing and processing substrates are described. In one embodiment, a substrate has a durable exterior surface bearing a temporary protective cover that protects the durable surface against contamination but that can readily be readily removed from the durable surface by washing with a given washing fluid.

22 Claims, 10 Drawing Sheets

U.S. PATENT DOCUMENTS

| | | | | |
|---|---|---|---|---|
| 4,166,018 A | | 8/1979 | Chapin | 204/192 R |
| 4,212,663 A | | 7/1980 | Aslami | 65/144 |
| 4,261,722 A | | 4/1981 | Novak et al. | 65/60 D |
| 4,351,861 A | | 9/1982 | Henery | 427/255.1 |
| 4,377,613 A | | 3/1983 | Gordon | 428/212 |
| 4,571,350 A | | 2/1986 | Parker et al. | 427/109 |
| 4,576,864 A | | 3/1986 | Krautter et al. | 428/328 |
| 4,894,133 A | | 1/1990 | Hedgcoth | 204/192.15 |
| 4,952,430 A | * | 8/1990 | Bowser et al. | 428/34 |
| 5,020,288 A | * | 6/1991 | Swensen | 52/202 |
| 5,090,985 A | | 2/1992 | Soubeyrand et al. | 65/60.52 |
| 5,107,643 A | | 4/1992 | Swensen | 52/202 |
| 5,302,449 A | * | 4/1994 | Eby et al. | 428/336 |
| 5,394,269 A | | 2/1995 | Takamatsu et al. | 359/580 |
| 5,401,543 A | | 3/1995 | O'Neill et al. | 427/580 |
| 5,453,459 A | | 9/1995 | Roberts | 524/123 |
| 5,520,996 A | | 5/1996 | Balian et al. | 428/216 |
| 5,594,585 A | | 1/1997 | Komatsu | 359/512 |
| 5,599,422 A | | 2/1997 | Adams, Jr. et al. | 156/510 |
| 5,624,760 A | | 4/1997 | Collins et al. | 428/426 |
| 5,645,699 A | | 7/1997 | Sieck | 204/192.12 |
| 5,674,658 A | | 10/1997 | Burberry et al. | 430/262 |
| 5,683,561 A | | 11/1997 | Hollars et al. | 204/298.25 |
| 5,698,262 A | | 12/1997 | Soubeyrand et al. | 427/255.3 |
| 5,733,660 A | | 3/1998 | Makita et al. | 428/426 |
| 5,762,674 A | | 6/1998 | Maltby, Jr. et al. | 65/60.1 |
| 5,866,199 A | | 2/1999 | Swidler | 427/154 |
| 5,866,260 A | | 2/1999 | Adams, Jr. et al. | 428/426 |
| 5,972,184 A | | 10/1999 | Hollars et al. | 204/298.09 |
| 6,124,044 A | | 9/2000 | Swidler | 428/500 |
| 6,156,171 A | | 12/2000 | Hollars et al. | 204/298.25 |
| 6,379,746 B1 | * | 4/2002 | Birch et al. | 427/154 |
| 6,660,365 B1 | | 12/2003 | Krisko et al. | 428/149 |
| 2002/0176988 A1 | * | 11/2002 | Medwick et al. | 428/408 |
| 2003/0003943 A1 | | 1/2003 | Bajikar | 455/550 |
| 2003/0039843 A1 | * | 2/2003 | Johnson et al. | 428/432 |

* cited by examiner

TEMPORARY PROTECTIVE COVERS

This application claims the benefit of provisional application 60/231,895 filed Sep. 11, 2000.

FIELD OF THE INVENTION

The present invention provides a temporary protective cover for substrates, such as glass and the like. More particularly, the invention provides a temporary cover that can be applied over a substrate surface to protect such surface from contamination.

BACKGROUND OF THE INVENTION

It can be difficult to prevent newly manufactured glass and other substrates from accumulating contaminants from the manufacturing environment. Manufacturing environments commonly contain organics and other residues that can contaminate the substrates being produced. For example, various solvents, curing products, and sealants used in manufacturing glass and glass products produce residues that can accumulate on the glass being produced. The atmosphere in the manufacturing facility may also contain vapors that condense on, or otherwise contaminate, the manufactured glass. For example, silicone is commonly used as a sealant in the manufacture of insulating glass units (IG units). Newly deposited silicone may outgas for significant periods of time. As a consequence, glass may accumulate silicone residue after simply being exposed to an ambient manufacturing environment. In fact, it has been discovered that this type of silicone contamination is very difficult to prevent. Unfortunately, silicone contamination can also be extremely difficult to remove.

Contamination can occur in several other ways during manufacturing processes. For example, glass sheets are commonly conveyed across rollers as they are coated. During conveyance, the bottom surface of the glass is in supportive contact with the rollers, which can leave minor impurities or traces of contact. While these imperfections tend to be very slight, they are unwanted and should be avoided if possible. Handling equipment used in producing glass products can also leave marks on the glass. For example, vacuumized suction cups are commonly used to handle glass sheets. This has been found to leave suction cup marks on the glass, at least in some instances. Stickers and other markings may also be applied during glass production. These stickers and markings tend to be easily removed. However, it can be difficult to assure they will have no permanent effect on the glass surfaces from which they are removed.

Glass sheets and other substrates are subjected to other contamination sources after leaving the manufacturing facility. For example, glass products may be exposed to a variety of storage and transport environments before reaching their final destination. Like manufacturing facilities, storage and transport environments may contain residues and vapors that can accumulate on and contaminate the products therein. For example, IG units and other products found in storage and transport environments may contain silicone sealants and other materials that can outgas for substantial periods of time. Of course, many of these environments are outside the manufacturer's control. Thus, while a manufacturer may attempt to control the environment within its own manufacturing and storage facilities, it would be very difficult to regulate each of the environments to which glass may be exposed prior to delivery to the ultimate consumer.

Contamination can also occur when glass products are installed or finished. The contamination that is perhaps most familiar to new homeowners occurs when window frames are painted and some of the paint unintentionally ends up on a window pane. While installers and painters can take steps to temporarily mask the surfaces of nearby glass (e.g., by applying "masking tape"), it can be difficult to mask the entire surface of the glass. Thus, any unmasked surface areas will still be vulnerable to unintentional spills and drips. Moreover, to the extent these tapes are applied with adhesive, it can be difficult to assure that no adhesive residue is left on the glass following removal.

Contamination sources like these can make it exceedingly difficult to manufacture, transport, install, and finish glass and other substrates that are free of surface contamination. The most obvious solution to this problem would be to simply remove the surface contamination, such as by washing or otherwise cleaning the contaminated surface. For example, various polishing and etching agents have been used to remove paint contamination from window panes. Technicians have even been known to use razorblades to scrape paint and the like off glass. Unfortunately, these aggressive treatments may actually remove some of the glass, leaving dull or scratched areas. Even with aggressive cleaning methods, certain contaminants (e.g., silicone) can be virtually impossible to remove.

Another solution would be to temporarily protect substrates during periods of potential contamination. In the past, attempts have been made to protect glass with removable papers and plastics. Typically, these papers and plastics are removed by mechanically peeling them from the substrate. Reference is made to U.S. Pat. No. 1,256,818 (Nile), U.S. Pat. No. 5,107,643 (Swensen), and U.S. Pat. Nos. 5,599,422 and 5,866,260 (both to Adams, Jr. et al.), the entire contents of each of which are incorporated herein by reference.

Unfortunately, protective papers and plastics have a number of disadvantages. For example, they are commonly applied using adhesives. These adhesives may react with glass, rendering them difficult to remove and possibly altering the surface properties of the glass. This may be particularly likely in cases where the glass is masked for long periods of time or where the masked glass is exposed to high temperatures or substantial radiation (e.g., sunlight). Components of certain papers and plastics, such as those containing silicone, may also react with glass in these ways. Non-adhesive applications, such as those relying on static cling, would seem possible. However, papers and plastics applied in this manner may be less secure than desired, perhaps even falling off during handling. Further, when protective papers and plastics are removed, they generate additional waste that must be discarded or recycled, thus creating additional labor and expense.

Attempts have also been made to temporarily protect glass by applying liquid coating compositions through a variety of wet deposition processes (e.g., painting, dipping, or spraying). While the resulting coatings vary in composition, many of them are polymeric materials that are removed by peeling or by washing with water. Reference is made to U.S. Pat. No. 5,453,459 (Roberts), U.S. Pat. Nos. 5,866,199 and 6,124,044 (both to Swidler), and International (PCT) Publication Numbers WO 00/50354 (McDonald) and WO 01/02496 (Medwick et al.). The Medwick et al. reference also discloses a sputtered carbon-containing coating that can be used to temporarily protect glass. The coating is said to be removable by combustion. For example, Medwick et al. expressly indicate that their coating would be oxidized and removed during tempering. Unfortunately, all of these approaches are less than ideal.

The limitations of these approaches become more apparent when one considers the full scope of processing that a typical window endures. Glass sheets can be formed by a number of processes, perhaps the most common of which is the float glass process. In this process, the basic elements of glass are combined and heated in a furnace to temperatures on the order of 2900° F., whereby the glass becomes molten. A ribbon of this glass is then floated atop a molten tin bath where it begins to cool and is machined to a desired width and thickness. The glass is then cut into smaller sheets.

Glass sheets can be coated with a variety of different coatings using a variety of different coating methods. Sputter deposition is a common method for applying coatings to large area substrates, such as glass for architectural applications. When glass sheets are coated by sputter deposition, the sheets are conveyed into a sputtering chamber. Typically, the glass is conveyed through a series of connected sputtering chambers (i.e., a sputtering line), each containing a controlled sputtering atmosphere. As the glass sheets are conveyed through the sputtering line, the desired coatings are sputtered onto the glass. At the outlet of the sputtering line, the glass is removed from the controlled sputtering atmosphere and is exposed to the ambient glass processing atmosphere. At this point, the coated glass may begin to accumulate contamination from the environment.

Thus, coated glass is typically vulnerable to becoming contaminated once it is removed from a controlled coating environment. As a consequence, it would be desirable to apply temporary protection to a coated substrate at the same time the substrate is coated. For example, it would be desirable to apply a temporary protective cover over sputter-coated glass before removing the glass from the sputtering line.

It would likely be difficult to apply papers, plastics, or liquid coating compositions inside a sputtering chamber. For example, the elevated substrate temperatures that occur during sputtering would tend to make application challenging. During sputtering, glass commonly reaches temperatures on the order of 100–200° C., and may reach even higher temperatures for certain processes. These temperatures would be above the softening points of many plastics and many adhesives used to apply papers or plastics. Further, conventional sputtering chambers are not configured for wet deposition processes. Thus, it would likely be impractical, if not impossible, to apply any of these protective materials in a sputtering chamber. Even if it were feasible to apply these protective materials in a sputtering chamber, these materials may not withstand the processing to which many substrates are subjected after they are coated.

Once glass is removed from a coating atmosphere (e.g., a sputtering chamber), it is typically covered with a so-called "separator". Typical separator comprises a protective powder (e.g., adipic acid powder), which protects the glass against moisture corrosion. The powder commonly contains small beads (e.g., nylon beads), which separate the glass sheets when they are stacked against one another. These beads prevent the surfaces of adjacent sheets in a stack from coming into contact with one another, thereby minimizing abrasion and other damage.

As noted above, glass sheets are sometimes assembled into IG units. As one of the first steps in this process, the separator is typically washed from the glass sheets. This is conventionally accomplished by passing the glass sheets through industrial glass washing machines. Industrial glass washers typically apply water, which may be hot, and optional detergents to the glass. Most protective papers and plastics would not be expected to survive being run through an industrial glass washer. Moreover, deterioration of these materials could create a terrible mess inside a washing machine, perhaps clogging the machine and complicating its maintenance. Further, many protective materials that are applied in liquid form are water soluble. Thus, it would be desirable to provide a temporary protective cover that is durable to industrial washing.

Coated glass may also be subjected to various elevated temperature processes, such as heat tempering or bending. During tempering, for example, glass is commonly heated to temperatures on the order of about 600° C. (1112° F.) for substantial periods of time (e.g., hours). Unfortunately, most protective papers, plastics, and polymeric materials would be burned-off, or at least significantly deteriorated, during elevated temperature processing. Likewise, the carbon-containing protective coating described in the Medwick et al. reference is said to be burned-off during tempering. Since tempered glass may be exposed to contamination sources after tempering (e.g., during subsequent storage, transport, installation, and finishing), it would be advantageous to provide a temporary protective cover that is durable to tempering.

It would be desirable to provide temporary protective covers that can be applied to coated substrates as part of the coating process. For example, it would be advantageous to provide temporary covers that can be applied to sputter-coated glass in the controlled sputtering environment. It would be particularly desirable to provide temporary covers that are sufficiently durable to withstand the full scope of processing that glass and other substrates typically endure. For example, it would be advantageous to provide temporary covers that are durable to industrial glass washing and the like. It would be especially desirable to provide a temporary cover that is durable to elevated temperature processing (e.g., heat tempering and bending). At the same time, it would be desirable to provide a temporary cover that can be readily removed after installation or finishing, or at any stage when it is desired to expose the underlying surface.

SUMMARY OF THE INVENTION

It has now been found that a substrate (e.g., glass) having a durable exterior surface (which can be formed by the substrate itself or by a coating formed on the substrate) can be protected against contamination by providing on the durable surface a temporary protective cover that breaks down and can be removed by washing the cover with a washing fluid that does not break down the durable surface of the substrate. The cover protects the durable surface from becoming contaminated with e.g., silicone used in the window industry. Once the cover is no longer desired, it can be washed readily from the durable surface with the washing fluid (e.g., which may be an aqueous acidic or alkaline solution, for example, vinegar). By removing the protective cover, which may itself become contaminated, the clean, pristine durable surface of the substrate is exposed.

One embodiment of the present invention provides a substrate having an exterior surface that is durable to a selected washing fluid. The exterior surface carries a temporary protective cover comprising a sputtered film that protects the exterior surface against contamination but that can readily be removed from the exterior surface by washing with the selected washing fluid.

In another embodiment of the invention, there is provided a substrate bearing an exterior coating that is durable to a selected washing fluid. The exterior coating carries a temporary protective cover comprising a film sputtered directly upon the exterior coating. The cover protects the exterior coating against contamination but can readily be removed from the exterior coating by washing with the selected washing fluid.

In still another embodiment, there is provided a substrate having an exterior surface that is durable to a selected washing fluid. The exterior surface carries a temporary protective cover that protects the exterior surface against contamination. The cover is durable to elevated temperatures on the order of about 600° C. but can readily be removed from the exterior surface by washing with the selected washing fluid.

In yet another embodiment, there is provided an insulating glass unit comprising spaced-apart panes having confronting interior surfaces that bound a between-pane space. At least one of the panes has an exterior surface that is durable to a selected washing fluid. This exterior surface carries a temporary protective cover comprising a sputtered film that protects the exterior surface against contamination but that can readily be removed from the exterior surface by washing with the selected washing fluid.

A further embodiment of the invention provides a method of producing substrates. The method comprises providing a substrate having generally-opposed interior and exterior surfaces. A durable coating is formed upon the exterior surface of the substrate. The coating comprises material that is durable to a selected washing fluid. A temporary protective cover is sputtered over the durable coating. The protective cover comprises material that protects the durable coating against contamination but that can readily be removed by washing with the selected washing fluid.

In another embodiment of the invention, there is provided a method of processing substrates. The method comprises providing a substrate having an exterior surface that is durable to a selected washing fluid. The exterior surface carries a temporary protective cover comprising a sputtered film that protects the exterior surface against contamination but that can readily be removed from the exterior surface by washing with the selected washing fluid. The covered exterior surface of the substrate is washed with the selected washing fluid to remove at least a portion of the cover, thereby exposing at least a portion of the underlying exterior surface.

In still another embodiment of the invention, there is provided a window assembly. The assembly comprises a window pane having an exterior surface that is durable to a selected washing fluid. The exterior surface carries a temporary protective cover comprising a sputtered film that can readily be removed by washing with the selected washing fluid. The assembly also comprises a frame structure to which the pane is secured by a bead of sealant. The bead of sealant is bonded on a first side directly to a peripheral portion of the protective cover. This peripheral portion of the cover overlies a peripheral region of the pane's exterior surface. The bead of sealant is bonded on a second side to the frame structure.

In yet another embodiment, there is provided a method of processing substrates. The method comprises providing a substrate having an interior surface and an exterior surface. Also provided is a sputtering line comprising a series of connected sputtering chambers, each chamber having a substrate support positioned therein. A first sputtering chamber includes a first lower target positioned below the support in the first chamber. A second sputtering chamber comprises a second lower target positioned below the support in the second chamber. The substrate is positioned on the support in the first sputtering chamber such that the exterior surface of the substrate is oriented toward the first lower target, and the first lower target is sputtered to deposit a first coating onto the exterior surface of the substrate. The first coating comprises material that is durable to a selected washing fluid. The substrate is positioned on the support in the second sputtering chamber such that the exterior surface of the substrate is oriented toward the second lower target, and the second lower target is sputtered to deposit a second coating onto the first coating. The second coating comprises material that can readily be removed from the first coating by washing with the selected washing fluid.

A further embodiment of the invention provides a substrate, such as a glass sheet, having an exterior surface that is durable in that it is highly resistant to a desired washing fluid. The exterior surface can be the surface of the substrate, or it can be a surface that results from depositing a coating onto the substrate. Surfaces and coatings that are not sufficiently durable to withstand conventional washing procedures, or the application of the desired washing fluid, are less desirable for use in the present embodiment. Directly upon the exterior surface is deposited a temporary protective cover of a type and of a thickness that protects the exterior surface from contamination, as by silicone rubber compounds, but that yet is of a nature enabling it to be readily broken down and washed from the exterior surface through use of the desired washing solution, preferably an aqueous solution, and most preferably a solution that is at least slightly basic or slightly acidic in nature.

In still another embodiment, the invention provides a method that can be used in the manufacture and installation of windows. The method involves providing a window with an exterior surface that is durable to a particular washing fluid, coating upon the exterior surface a protective cover to protect the exterior surface from contamination, and eventually washing the protective cover from the exterior surface with a washing fluid capable of breaking up the protective cover but not harming the exterior surface.

Figure 1:
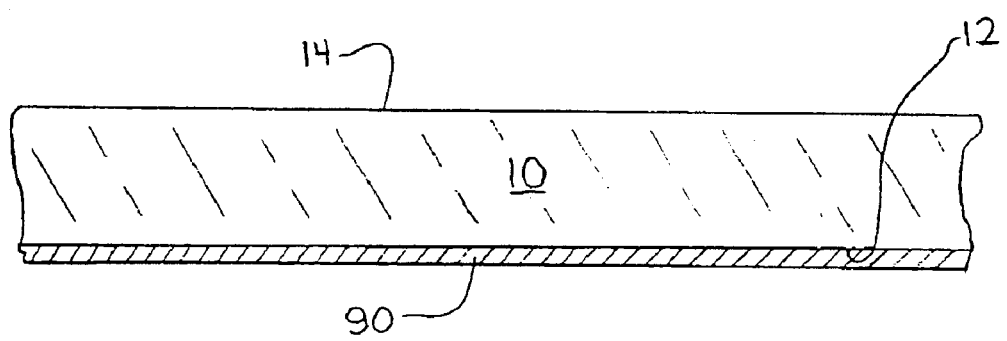
FIG. 1 is a schematic cross-sectional view of a substrate having a surface carrying a temporary cover in accordance with one embodiment of the invention.

DETAILED DESCRIPTION OF THE
PREFERRED EMBODIMENTS

The following detailed description is to be read with reference to the drawings, in which like elements in different drawings have been given like reference numerals. The drawings, which are not necessarily to scale, depict selected embodiments and are not intended to limit the scope of the invention. Examples of constructions, materials, dimensions, and manufacturing processes are provided for selected elements. All other elements employ that which is known to those of skill in the art of the invention. Skilled artisans will recognize that the examples provided herein have many suitable alternatives that can be utilized, and which fall within the scope of the invention.

FIG. 1 illustrates a substrate 10 having an exterior surface 12 that carries a temporary protective cover 90 of the present invention. The exterior surface of the substrate is designated by the reference numeral 12, and the interior surface is designated by the reference numeral 14. The designations herein of "interior" and "exterior" surfaces are somewhat arbitrary. For example, neither the "exterior" surface nor the "interior" must necessarily be exposed to an outdoor environment, unless such requirement is explicitly stated.

Substrates suitable for use in connection with the present invention include the particular substrate class comprising generally flat, sheet-like substrates. A substrate of this nature typically has two generally-opposed major surfaces 12, 14. For example, this class of substrates includes sheets of glass and the like. In fact, temporary protective covers of the invention can be used quite advantageously to protect glass substrates from becoming contaminated. One type of glass substrate that is commonly used in manufacturing glass articles (e.g., insulating glass units) is generally referred to as soda-lime glass. Other types of glass that may be suitable include those generally referred to as alkali-lime-silicon dioxide glass, boro-silicon dioxidete glass, alumnino-silicon dioxidete glass, boro-alumino silicon dioxidete glass, phosphate glass, and fused silicon dioxide. It is noted that the substrate 10 is not required to be transparent. For example, opaque substrates may be useful in some cases. However, it is anticipated that for most applications, the substrate will comprise a transparent or translucent material, such as glass or clear plastic.

The present temporary covers can be used to protect virtually any substrate surface or coating from becoming contaminated. Preferably, the cover is carried by a durable exterior surface. The durable exterior surface may be formed by the substrate itself. Alternatively, the exterior surface may be formed by a coating on the substrate. Desirably, the exterior surface has good mechanical durability. For example, this surface preferably has sufficient mechanical durability to withstand the rigors of common window washing techniques without becoming unacceptably scratched or otherwise damaged. It is also desirable for the durable surface to be resistant to attack by (i.e., stable in the presence of) a washing fluid that is at least slightly acidic or basic. Preferably, this surface is resistant to attack by a mild acid or a mild base. Optimally, it is entirely unaffected by contact with mild acids and mild bases.

As the durable exterior surface will be exposed following removal of the protective cover 90, it is desirable that this surface be sufficiently durable to withstand the environment to which it will be exposed. In some cases, the exterior surface will be destined for exposure to an outdoor environment. In these cases, the exterior surface is preferably durable to (i.e., adapted to withstand) prolonged exposure to external (i.e., outdoor) weather conditions, such as periodic contact with rain (i.e., water which may be slightly acidic or basic). Thus, the exterior surface carrying the cover is desirably both physically and chemically durable.

Figure 5:
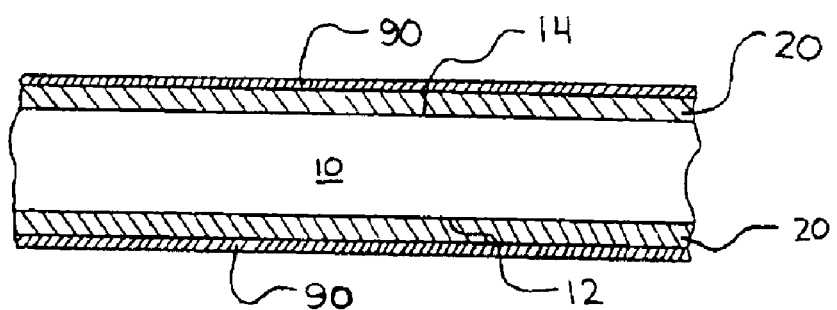
FIG. 5 is a schematic cross-sectional view of a substrate having two coated surfaces each carrying a temporary cover in accordance with a further embodiment of the invention.

In the embodiment of FIG. 1, there is provided a substrate 10 having a temporary protective cover 90 applied directly to a surface of the substrate. In more detail, the cover 90 is carried on the exterior surface 12 of the illustrated substrate 10. In this embodiment, the interior surface 14 of the substrate 10 is not protected by a cover 90. If so desired, however, protective covers 90 can be carried on both sides of a substrate, whether such substrate is entirely uncoated or coated on one or both surfaces 12, 14. For example, FIG. 5 illustrates an embodiment wherein there is provided a substrate 10 having a first coating 20 carrying a first cover 90 on the interior substrate surface 14 and a second coating 20 carrying a second cover 90 on the exterior substrate surface 12. In such embodiments, both major surfaces 12, 14 of the substrate 10 would be protected against contamination.

As noted above, the present covers 90 can be used quite advantageously to prevent contamination of a substrate coating. There is virtually no limit on the types of coatings that would benefit from such temporary protection. Thus, the present cover 90 can be used to protect coatings of any type and nature. As described above, coatings underlying the protective cover 90 are desirably durable enough to withstand the environment to which they are destined to be exposed upon removal of the protective covers 90.

Figure 2:
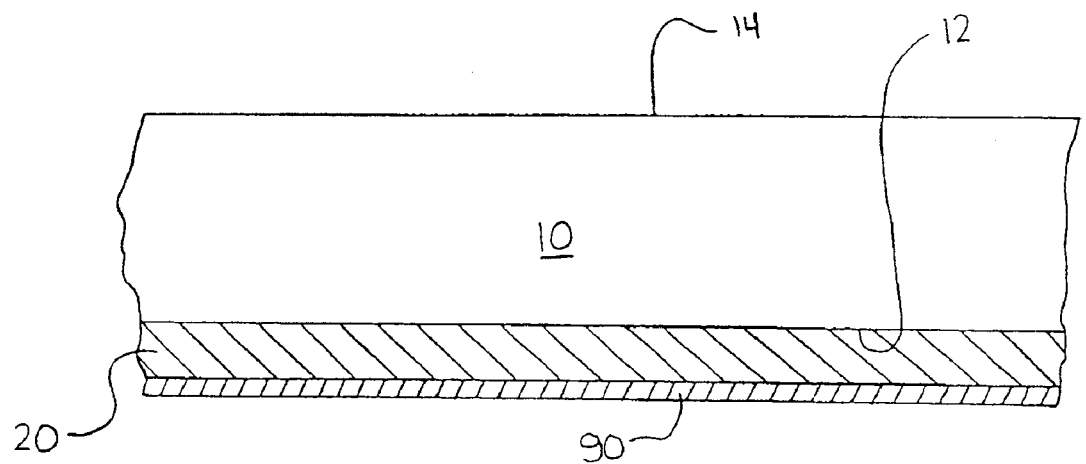
FIG. 2 is a is a schematic cross-sectional view of a substrate having a coated surface carrying a temporary cover in accordance with another embodiment of the present invention.

FIG. 2 illustrates an embodiment wherein a substrate 10 has an exterior surface 12 bearing a coating 20 that carries a temporary protective cover 90. The coating 20 can be any desired single-layer coating or multiple-layer film stack. While several useful coatings are described below, an exploration of all available coating types is beyond the scope of the present disclosure. Moreover, those skilled in the present art would have no problem selecting different coatings 20 for different applications.

The temporary protective cover 90 of the present invention are particularly useful for protecting substrates that have hydrophilic surface properties. As noted above, glass sheets that initially have hydrophilic surface properties may become contaminated at various stages of production. For example, it has been discovered to be surprisingly difficult to produce architectural glass bearing hydrophilic coatings without materials like silicone contaminating the coated glass. Unfortunately, silicone and other contaminants can cause otherwise hydrophilic surfaces to become undesirably hydrophobic. However, by temporarily protecting newly manufactured hydrophilic coatings with the present covers 90, a manufacturer can be more assured that the ultimate consumer will enjoy the intended hydrophilic properties of these coatings.

It may be very desirable to produce glass bearing a hydrophilic coating. Hydrophilic coatings have an affinity for water and tend to cause water applied thereto to sheet. The production of glass and other substrates having hydrophilic surface properties can be surprisingly challenging. As described in U.S. patent applications Ser. Nos. 09/868,542, 09/868,543, 09/599,301, and 09/572,766, the entire contents of each of which are incorporated herein by reference, hydrophilic coatings may be particularly advantageous when used on architectural glass and other substrates. For example, these coatings are believed to resist formation of water stains, thereby promoting a longer lasting clean appearance.

In one embodiment, a substrate 10 like that shown in FIG. 2 bears a hydrophilic coating 20. In the illustrated embodiment, the hydrophilic coating 20 is formed directly upon the exterior surface 12 of the substrate 10, although this is by no means a requirement. As described below, the hydrophilic coating 20 may alternatively be formed upon one or more previously deposited films on the substrate 10. The hydrophilic coating 20 carries a temporary protective cover 90 in accordance with the present invention. The illustrated cover 90 is formed directly upon the hydrophilic coating 20, although this is not required. In the illustrated embodiment, the interior surface 14 of the substrate 10 does not carry a protective cover, although, one could be provided if so desired.

The present temporary cover 90 can be used advantageously to prevent contamination of any type of hydrophilic coating or surface. While FIG. 2 shows a substrate 10 bearing a discrete hydrophilic coating 20, this is not a requirement of the invention. For example, the surface of the substrate 10 may itself be hydrophilic. This may be an inherent property of the substrate material, or it may be a result of a particular surface treatment performed upon the substrate 10. The term "hydrophilic" is used herein to refer to any coating or surface that tends to cause water applied thereto to form a sheet, rather than to bead up. For example, hydrophilic coatings and surfaces would be expected to have a contact angle with water, prior to being at all contaminated, of less than about 25 degrees.

The present cover 90 can be used in conjunction with any desired type of hydrophilic coating. As described below, in one particularly preferred embodiment, the hydrophilic coating 20 is an oxide. However, this is by no means a requirement, as a variety of suitable materials could be used. Preferably, the hydrophilic coating 20 is formed of material that has a contact angle with water of less than about 25 degrees before the coating 20 is exposed to any environmental contamination and after the protective cover 90 has been removed.

In a particularly preferred embodiment, the hydrophilic coating 20 is a certain preferred water-sheeting coating. The preferred water-sheeting coating is described in detail in U.S. patent applications Ser. Nos. 09/868,542 and 09/599,301, the entire teachings of each of which are incorporated herein by reference. The coating is comprised of silicon dioxide, which advantageously is substantially non-porous. As described below, the exterior face of the silicon dioxide may have an irregular surface. Accordingly, attributing a specific thickness to such a coating may be somewhat difficult and inaccurate. However, a median thickness of between about 15 angstroms and about 350 angstroms is believed to be preferred, with a median thickness of between about 15 angstroms and about 150 angstroms being more preferred. The major benefit of this coating 20 at the least cost is believed to be evidenced at a median thickness range of between about 20 angstroms and about 120 angstroms.

The preferred water-sheeting coating 20 is preferably applied by sputtering. Sputtering techniques and equipment are well known in the art. For example, magnetron sputtering chambers and related equipment are commercially available from a variety of sources (e.g., Leybold and BOC Coating Technology). Useful magnetron sputtering techniques and equipment are also disclosed in U.S. Pat. No. 4,166,018 (Chapin) and U.S. Pat. No. 5,645,699 (Sieck), the entire teachings of each of which are incorporated herein by reference.

Generally speaking, magnetron sputtering involves providing at least one target formed of material to be deposited upon a substrate 10. In this process, a clean substrate (e.g., glass) is placed in a coating chamber which is evacuated, preferably to less than $10^{-4}$ torr, more preferably less than $2 \times 10^{-5}$ torr. The target is provided with a negative charge and a relatively positively charged anode is positioned adjacent the target. By introducing a relatively small amount of a desired gas into the chamber adjacent the target, a plasma of that gas can be established. Particles (e.g., ions) in the plasma collide with the target, knocking target material off the target and sputtering it onto the substrate. To facilitate this process, it is known to position magnets behind the target to shape and focus the plasma about a sputtering surface of the target.

Conventional magnetron sputtering techniques and equipment can be used to apply the preferred water-sheeting coating 20. For example, this coating 20 can be deposited by sputtering silicon dioxide targets in an inert atmosphere. However, it can be extremely difficult to reliably sputter silicon dioxide targets. This is because targets serve as cathodes in conventional magnetron sputtering processes and because silicon dioxide is a poor conductor. As a result, it is preferred that the water-sheeting coating 20 be deposited using targets comprising metallic silicon rather than silicon dioxide. The material actually deposited on the substrate can be converted to silicon dioxide by employing a sputtering atmosphere that includes oxygen.

The silicon targets are preferably not formed of pure silicon. Rather, the targets more preferably comprise a compound of silicon and aluminum. Pure silicon targets are difficult to sputter in a consistent, controlled fashion because silicon is a semiconductor. As a consequence, some of the silicon dioxide (which is non-conductive) that is emitted when sputtering pure silicon targets is re-deposited on the target surfaces, as well as on the anodes and surrounding shields in the sputtering chamber. This can affect the flow of current, which in turn may cause arcing if sputtering is continued. Thus, to reduce arcing, it is preferred that the targets include about 5% aluminum or the like. Targets of this nature are available from well known commercial suppliers, such as Bekaert VDS nv, which is located in Deinze, Belgium.

The atmosphere in the sputtering chamber can be varied to achieve an optimized sputtering rate. An oxidizing sputtering atmosphere is preferably employed in cases where silicon or silicon-aluminum targets are used. Of course, the sputtering atmosphere need not be pure oxygen in these cases. To the contrary, a mixture comprising oxygen and inert gas (e.g., argon) will tend to enhance the sputtering rate. For example, it is believed that a sputtering atmosphere comprising oxygen and up to about 40% argon (preferably 0–20% argon) maintained at about $3 \times 10^{-3}$ mbar will suffice. The power applied to each target is preferably optimized to reduce arcing yet maximize sputtering rate.

One manufacturing arrangement that has given good results employs three rotary sputtering targets of silicon doped with about 5% aluminum (i.e., about 95% silicon and about 5% aluminum) with a power of about 42 kW applied to each target. The atmosphere in the sputtering chamber may comprise 100% $O_2$ at a pressure of about 2.5–4.5 mTorr. Alternatively, an atmosphere comprising about 80% oxygen and about 20% argon maintained at about $3 \times 10^{-3}$ mbar can be used. The substrate 10 can be moved past the sputtering targets at about 100–500 inches per minute. Of course, the precise operating conditions (e.g., substrate speed, power, plasma composition, target composition, etc.) under which the preferred water-sheeting coating 20 is applied can be varied as desired to optimize deposition of this coating 20 at different thicknesses. Given the present teaching as a guide, one of ordinary skill in the art would be able to readily select and vary suitable operating conditions to apply the preferred water-sheeting coating 20 at different thicknesses.

Thus, in a particularly preferred method of the invention, the preferred water-sheeting coating 20 is deposited by moving a substrate 10 beneath a plurality of silicon-aluminum targets while sputtering the targets in an oxidizing atmosphere. If so desired, this atmosphere may consist only of oxygen and inert gas. While this is by no means a requirement, sputtering atmospheres of this nature have given good results. A coating 20 deposited by such a method would be expected to consist only of silicon dioxide and perhaps a small amount of aluminum (or another metal provided in the targets to enhance conductivity), at least when initially deposited.

It has been found that sputter depositing silicon dioxide on a substrate in accordance with the present disclosure yields a coating with a significantly more irregular surface than uncoated glass surfaces. Photomicrographs of the preferred water-sheeting coating 20 (which are illustrated in the above-incorporated U.S. patent application Ser. No. 09/868,542) illustrate a surface characterized by a plurality of spaced-apart fairly sharp, distinct peaks rising significantly above the rest of the surface. While it is acknowledged that these micrographs may be atypical of the overall surfaces of such coatings, they do appear to suggest that the surface of the present water-sheeting coating 20 is irregular and substantially non-porous.

The behavior of a sheet of glass bearing the preferred water-sheeting coating 20 is visibly different from that of a similar sheet of glass not bearing such a coating. A glass surface bearing the preferred water-sheeting coating 20 tends to sheet water more readily and is noticeably easier to clean to the point where no visible streaks or defects remain than is a comparable sheet of uncoated glass under the same conditions.

To provide an accurate comparison of the preferred water-sheeting coating 20 to a directly comparable sheet of glass not bearing the coating, a comparative sample was prepared. A plain, untreated pane of glass was thoroughly cleaned and laid horizontally on a set of rollers. A small, square piece of glass was laid on the upper surface of the pane of glass to serve as a template covering part of the surface of the pane. The pane and overlying template were passed into a magnetron sputtering chamber and a coating of about 35 angstroms of $SiO_2$ was deposited. The template was then removed, leaving a pane of glass with the preferred water-sheeting coating 20 over most of its surface, but having an uncoated area that was beneath the template during sputtering. The opposite side of the glass, i.e., the side of the glass facing away from the side provided with the $SiO_2$ coating, was coated with a low-emissivity, infrared-reflective film stack having two silver layers spaced apart from one another and from the glass by a plurality of dielectric layers.

The partially coated surface of the glass pane was visibly inspected. When completely clean, the boundaries of the uncoated area that was beneath the template during sputtering were essentially undetectable to the unaided eye, indicating that the water-sheeting coating had a minimal impact on the basic optical properties of the glass. A fine spray of atomized water droplets was sprayed on the surface using a simple, hand-operated spray bottle of the type conventionally used to spray household cleaning products. Once the spray was applied, the boundaries of the uncoated area were readily visible. The water on the area bearing the coating sheeted to an apparently uniform film of water, but the area without the coating had a less uniform appearance.

A conventional cleaning solution commercially available under the trademark Windex® was sprayed on the surface of the glass pane and the surface was wiped with a paper towel until the area bearing the water-sheeting coating appeared dry and no longer showed any visible streaks. At this time, the uncoated area still had visible streaks of moisture. While these visible streaks on the uncoated area eventually dried without leaving any substantial residual streaking on the glass, it is believed that the average person would tend to continue to wipe this area until all visible streaks disappeared, meaning that the person would expend less time and effort cleaning a glass article bearing the water-sheeting coating 20 than a glass article without such a coating. These results indicate that the preferred water-sheeting coating 20 makes glass coated therewith significantly easier to clean than uncoated glass.

While the hydrophilic coating 20 can be quite advantageously formed of sputtered silicon dioxide, as just described, this is by no means a requirement. Rather, any desired hydrophilic coating can be used. For example, other useful hydrophilic coatings are described in U.S. patent application Ser. No. 09/576,766, the entire teachings of which are incorporated herein by reference. Further, those skilled in the art may wish to employ other types of hydrophilic coatings, all of which would derive particular benefit from the present covers 90.

The present cover 90 can also be used beneficially to protect photocatalytic surfaces from becoming contaminated. For example, the exterior coating 20 in the embodiment of the FIG. 2 can be a photocatalytic coating. Photocatalytic surfaces are known to chemically degrade organic materials. The benefits of protecting photocatalytic surfaces against contamination can be exemplified without an exhaustive review of photocatalysis. Briefly, it has long been known that certain metal oxides have the ability to absorb ultraviolet radiation and break down organic materials, such as oil, plant matter, fats, greases, and the like. Thus, photocatalytic surfaces exhibit somewhat self-cleaning surface properties. The most powerful of the photocatalytic materials appears to be titania, though other metal oxides appear to exhibit photoactivity as well.

Glass and other substrates bearing photocatalytic coatings would have a variety of potential applications. For example, self-cleaning windows would, of course, be quite desirable. As is well known to home owners, keeping windows and other glass surfaces clean can be relatively time consuming. While keeping a few windows clean may not be terribly difficult, keeping a large number of windows clean can be a significant burden. For example, the cleaning of modem glass office towers involves significant time and expense, as teams of window washers are needed to regularly clean these. Thus, the potential benefit of self-cleaning windows is apparent.

Even when a highly photocatalytic coating is produced, the photocatalytic properties of the coating could be reduced as a result of surface contamination. For example, while photocatalytic surfaces tend to degrade organic contaminants, they typically do not break down inorganic materials. Consequently, photocatalytic windows and the like may be vulnerable to becoming contaminated with inorganic residues. Thus, a particularly advantageous application of the present cover 90 involves their employment in protecting photocatalytic surfaces from becoming contaminated. Thus, by applying the present covers 90 to newly produced photocatalytic coatings, a manufacturer can protect these coatings from becoming contaminated during manufacturing, storage, transport, installation, and finishing.

A variety of photocatalytic coatings can be formed using a variety of deposition processes. For example, useful photocatalytic coatings are described in U.S. Pat. No. 5,874,701 (Watanabe et al), U.S. Pat. No. 5,853,866 (Watanabe et al), U.S. Pat. No. 5,961,843 (Hayakawa et al.), U.S. Pat. No. 6,139,803 (Watanabe et al), U.S. Pat. No. 6,191,062 (Hayakawa et al.), U.S. Pat. No. 5,939,194 (Hashimoto et al.), U.S. Pat. No. 6,013,372 (Hayakawa et al.), U.S. Pat. No. 6,090,489 (Hayakawa et al.), U.S. Pat. No. 6,210,779 (Watanabe et al), U.S. Pat. No. 6,165,256 (Hayakawa et al.), U.S. Pat. No. 5,616,532 (Heller et al.), U.S. Pat. No. 5,849,200, (Hayakawa et al.), and 5,845,169, (Hayakawa et al.), the entire contents of each of which are incorporated herein by reference. A discussion of all known photocatalytic coatings is beyond the scope of the present disclosure, as the present cover 90 are anticipated to be useful in protecting essentially any photocatalytic coating, including photocatalytic coatings not yet discovered. It is anticipated, though, that the most suitable photocatalytic coatings will comprise an inorganic titanium compound, such as an oxide of titanium.

In a particularly advantageous embodiment, the photocatalytic coating comprises a sputtered film of titanium oxide. The titanium oxide can be sputter deposited in several ways. First, targets formed of metallic titanium can be sputtered in oxidizing atmospheres. Unfortunately, this process is quite slow. Second, targets formed of titanium dioxide can be sputtered in inert atmospheres. However, titanium dioxide targets suffer from low electrical conductivity. Hence, they are difficult to stably sputter at high power levels. Therefore, if titanium dioxide targets are used to deposit the present photocatalytic titanium oxide coating, such methods are preferably limited to low power/low deposition rate sputtering processes.

In a preferred method, the present photocatalytic coating is deposited by sputtering substoichiometric titanium oxide targets. These targets are especially preferred since they have high electrical conductivity, allowing them to be sputtered at high rates. Targets of this nature are described in U.S. patent application Ser. No. 60/262,878, the entire contents of which are incorporated herein by reference. Targets of this nature are available from well known commercial suppliers, such as Bekaert VDS nv, which is located in Deinze, Belgium. Thus, in favored method, the preferred titanium oxide film is deposited by positioning a substrate beneath one or more substoichiometric titanium oxide targets. The targets are then sputtered, most preferably in a sputtering atmosphere comprising argon, oxygen, or a mixture of argon and oxygen. Suitable mixtures include 70–90% argon by volume and 10–30% oxygen by volume. The use of substoichiometric titanium oxide targets is also described in U.S. patent applications Ser. Nos. 09/024,240, 09/024,071, and 09/044,681 (all to Vanderstraeten), the entire teachings of each of which are incorporated herein by reference.

It is particularly desirable that the present cover 90 comprise inorganic material when such cover 90 are intended to be carried upon photocatalytic coatings. For example, the exterior coating 20 illustrated in FIG. 2 could be a photocatalytic coating. As noted above, photocatalytic surfaces tend to chemically degrade organic material. Thus, if a cover 90 consisting of organic material were carried directly upon a photocatalytic coating, then the cover 90 may deteriorate as a result of the decomposition ability of the photocatalytic coating. Thus, in embodiments wherein a protective cover 90 is carried directly upon a photocatalytic coating 20, the cover 90 preferably comprises an inorganic material that is durable to the photoactivity of such coating 20.

In the embodiment of FIG. 2, the substrate 10 bears a photocatalytic coating 20 on its exterior surface 12, while its interior surface 14 is uncoated. In another embodiment (not shown), the interior surface 14 of a substrate 10 like that shown in FIG. 2 is provided with a reflective coating 30. This reflective coating 30 can take any desired form depending on its desired properties. For example, it may be beneficial to use an infrared-reflective coating 30 like that discussed with reference to FIG. 3. Further, it may be advantageous to provide a temporary protective cover over such a reflective coating.

The substrate 10 shown in FIG. 2 bears a photocatalytic coating 20 directly upon its exterior surface 12. The photocatalytic coating 20 can alternatively be borne upon a film previously deposited on the exterior surface 12 of the substrate 10. Such film may comprise one or more layers selected to impart desired properties in the substrate. Embodiments of this nature are described herein with reference to FIG. 6.

The temporary protective cover 90 desirably comprises a film that is quite thin (e.g., on the order of 2500 angstroms or less). In fact, the protective cover 90 preferably has a total thickness of less than about 100 angstroms. Thicknesses in this range are preferable as they facilitate complete, uniform removal of the cover 90 upon washing the covered surface of the substrate with the desired washing fluid. The terms "covered surface" and "covered substrate" are used herein to refer respectively to a surface and a substrate at a time when the cover 90 is in place (i.e., before the cover has been removed).

Covers 90 having a thickness of more than 100 angstroms may be beneficial for certain applications. However, it has been discovered that such covers are not as easily washed away. For example, unusually thick covers have been found to require longer washing times. Moreover, one must be careful to completely and uniformly remove such covers during the washing process. Further, when an unusually thick cover is used, washing is more likely to leave an irregular surface, retaining unremoved material from the cover 90. These irregular surfaces have been found to possess an undesirable wavy or blotchy appearance. Moreover, it has been discovered that it is difficult to determine when the entire cover 90 has been washed away if an unusually thick cover 90 is used.

It should be noted, however, that the thickness of the cover 90 could be increased beyond the preferred range mentioned above. For example, it is not a requirement for the temporary cover 90 to have an optically insignificant thickness. The present cover 90 are intended to be removed. Thus, they can be deposited at an optically significant thickness. In many cases, though, it will be preferable to employ a cover 90 that is optically insignificant. For example, it may be desirable to manufacture glass sheets that carry temporary protective cover 90 on both major surfaces (i.e., the interior surface and the exterior surface). When glass sheets are incorporated into multiple-pane IG units, the inner surfaces of the panes will be exposed to the protected space between the panes (i.e., the "between-pane space"), while the outer surfaces will be exposed to an environment external to the IG unit (i.e., they will not be encased within the between-pane space). Thus, it may be desirable to have the flexibility to leave the protective cover 90 on surfaces that are destined to be encased within the between-pane space of an IG unit. In these cases, the cover 90 that will be left on the glass are, of course, preferably optically insignificant, so as not to change the optical properties of the IG unit. Unless the encased surfaces of an IG unit become visibly contaminated, removing the cover 90 from these surfaces may be unnecessary.

In most cases, it is anticipated that the preferred thickness range for the protective cover 90 will be less than about 100 angstroms. As noted above, the present cover 90 are preferably removable upon being washed with a weak acid or a weak base. Therefore, no particular maximum thickness is required. However, the cover 90 should be thick enough to provide protection against contamination from silicones and other environmental organics and residues. That is, the cover 90 is preferably thick enough and dense enough to prevent such contamination from permeating the cover 90 and contaminating the underlying surface. It is anticipated that a protective cover 90 formed in accordance with the present teaching and having a thickness as small as about 5–10 angstroms would be suitable to serve this purpose. However, the major benefit of the present cover 90 in terms of protection against contamination and predictably uniform removability is believed to exist at a range of between about 25 angstroms and about 60 angstroms, perhaps optimally between about 25 angstroms and about 45 angstroms.

The optimal thickness range for a particular cover 90 may depend upon the type of substrate to which the cover 90 is applied and upon the production procedures for such substrate. For example, glass sheets are commonly tempered during production. Tempering may be performed to increase the mechanical hardness of glass or to create internal stresses in glass that will cause such glass to shatter into many tiny pieces when broken, rather than breaking into large, dangerous shards. During tempering, glass is subjected to elevated temperatures before being cooled at a controlled rate. For example, tempered glass is commonly heated to temperatures at or near the melting point of glass.

More specifically, tempering temperatures on the order of 600 degrees C. are common. Moreover, glass may be subjected to these high temperatures for extended periods of time (e.g., hours).

Unfortunately, the existing protective coatings discussed above (e.g., papers, plastics, polymers, and the like) would not be expected to survive the elevated temperatures associated with glass tempering. For example, the above-noted Medwick et al. reference discloses a sputtered carbon-containing coating that is expressly stated to be burned-off during tempering. To the contrary, protective cover 90 of the present invention have been found to endure glass tempering quite well. In fact, the present cover 90 are believed to be ideal for use on glass that is tempered (or otherwise heat-treated) after it has been coated. It has been discovered, though, that certain protective cover 90 having thicknesses of less than about 20 angstroms can be negatively impacted by glass tempering procedures. As described below, these covers appear to become less protective than is desired after being subjected to glass tempering procedures. While this phenomenon does not appear to have been satisfactorily explained, it is surmised to be a result of the cover 90 material recrystallizing and changing in density during the tempering process. Thus, the present cover 90 desirably have thicknesses of at least about 20 angstroms, more preferably at least about 25 angstroms, when such cover 90 are destined to be tempered or otherwise heat-treated. It is anticipated, though, that the present cover 90 would be quite effective in protecting non-temperable substrates at thicknesses as small as several angstroms.

The temporary protective cover 90 may comprise a film of any suitable material having the desired characteristics. As just described, it is advantageous to form the protective cover 90 of material that is durable to elevated temperatures (e.g., glass tempering temperatures) on the order of about 600 degrees C. In one embodiment, the cover material is one that is stable in the presence of water having a neutral pH, but breaks down, dissolves, softens, or otherwise deteriorates in the presence of a washing fluid that is at least slightly acidic or slightly basic. For example, the cover 90 may be formed of material that breaks down in the presence of a mild acid or a mild base. In a preferred embodiment, the cover 90 is formed of material that breaks down in the presence of a weak organic acid, such as common household vinegar. While the acidity of different vinegars may vary, the pH of common household vinegar is estimated to be about 3. Alternatively, the temporary cover 90 can be formed of material that breaks down in the presence of a weak base, such as a weak ammonia solution. For example, in one such embodiment, the cover 90 comprises a material that breaks down in the presence of a common household ammonia solution, which is estimated to have a pH of between about 11 and about 12.5.

The present temporary cover 90 can be formed of material that breaks down in the presence of any desired washing fluid, whether or not such washing fluid is at all acidic or basic. Of course, the exterior surface beneath the cover 90 is preferably formed of material that is durable to the desired washing fluid. Since it is preferable in most cases to form the protective cover 90 of material that is durable to industrial glass washing processes, the desired washing fluid will typically be one that is at least slightly acidic or basic.

Thus, the composition of the protective cover 90 is preferably selected so as to complement the composition of the durable surface that will carry the cover 90. In more detail, it is preferable to form the protective cover 90 of material that will break down in the presence of a selected washing fluid, which washing fluid conjointly will not break down or otherwise adversely affect the underlying surface.

For example, the cover 90 is preferably formed of material that can be completely and uniformly removed when washed with the selected washing fluid. Furthermore, the exterior surface that carries the protective cover 90, and is ultimately exposed upon removing the cover 90, is preferably durable to (i.e., it does not substantially break down, dissolve, soften, or otherwise deteriorate in the presence of) the selected washing fluid. Therefore, the material of the cover 90 is advantageously selected to complement the nature of the surface it is intended to temporarily protect: the cover 90 is formed of material selected to break down when contacted by a washing fluid to which the underlying surface is durable.

Thus, when the cover 90 is carried by a sheet of glass, the cover 90 is advantageously formed of material that will withstand the rigors of conventional glass production. In such embodiments, the cover 90 is preferably stable in the presence of hot water and conventional glass detergents, such as may be present in industrial glass washing machines.

As described above, it may be advantageous to form the temporary cover 90 of an inorganic material. For example, this may be preferred in cases where the underlying surface has a photocatalytic effect. When the cover 90 is carried by a surface that is photocatalytic, the cover 90 may deteriorate as a result of the decomposition ability of the photocatalytic surface. Inorganic materials are generally thought to be durable to photoactivity. Thus, when a protective cover 90 is carried on a photocatalytic surface, it is particularly preferred to form the cover 90 of an inorganic material.

In one embodiment of the invention, the temporary protective cover 90 comprises an oxide of a metal. The term "metal" is used herein to refer to metals and metalloids or semi-metals. Metal oxides tend to be advantageous for a number of reasons. For example, the carbon-containing coating of the above-noted Medwick et al. reference reportedly may draw oxygen out of a functional layer, to the extent such layer contains oxygen, upon which the carbon-containing coating may be deposited. To the contrary, one would not expect such a phenomenon to occur when using a protective cover 90 that is a metal oxide, since a metal oxide is by definition already oxidized. Metal oxides also tend to have the desired level of durability. Further, metal oxides can typically be deposited using a variety of deposition techniques. In a particularly preferred embodiment, the present cover 90 comprises one or more of a number of preferred metal oxides. These preferred metal oxides include oxides of metals selected from the group consisting of zinc, bismuth, cadmium, iron, and nickel. The oxides of this group are stable in water, but tend to break down in the presence of weak acids or weak bases. Thus, they are readily removed when washed with washing fluids that are mildly acidic or mildly basic. They are also believed to be adequately protective at the desired thickness ranges described herein.

It has been discovered that zinc oxide is markedly well suited for use as a temporary protective cover 90. Zinc oxide is especially preferred for a number of reasons. For example, it has been found that zinc oxide is effective in protecting the underlying surface against surface contamination at a thickness of less than about 100 angstroms. In fact, protective cover 90 formed of zinc oxide have been found to be effective in protecting against surface contamination at thicknesses of about 20 angstroms or less, although thicknesses of at least about 25 angstroms are preferred when the cover 90 is destined to undergo glass tempering. Further, it has been discovered that zinc oxide is particularly easy to remove in a complete and uniform manner when washed with a weak acid or a weak base (e.g., vinegar). Zinc oxide can also be sputtered at a very high rate and is consequently deposited at relatively low cost.

In one preferred embodiment, the temporary cover 90 comprises a sputtered zinc oxide film having a thickness of at least about 25 angstroms, more preferably between about 25 angstroms and about 60 angstroms, and perhaps optimally between about 25 angstroms and about 45 angstroms. As is described below, sputtered zinc oxide cover 90 in this thickness range have been found to be particularly effective in protecting substrate surfaces against contamination (e.g., when exposed to silicone), while being reliably removable in a complete, uniform manner upon the application of a weak acid or a weak base. Moreover, such zinc oxide covers tend to be durable to glass tempering procedures.

Thus, the temporary cover 90 of the present invention desirably has several characteristics. First, when applied to a durable surface at an easily removable thickness, it has the capacity to protect that surface from contamination, such as by silicone vapor or residue. Second, at the thickness used, the temporary cover is capable of being broken down and removed from the underlying surface with some ease by being washed with the desired washing fluid (e.g., an aqueous solution that is at least slightly basic or slightly acidic). By "broken down" or "breaks down" as used herein, we mean that the temporary cover 90 is actually removed during the washing step. It is not removed in the manner that a protective polymer film might be mechanically peeled (or pulled) from the surface that is to be protected. Rather, the temporary cover 90 is capable of being dissolved in the desired washing fluid, or at least being softened or swollen in the washing fluid so that it tends to disintegrate during the washing process. Preferably, substantially the entire cover 90 is removed during washing. Ideally, the cover 90 is capable of being removed completely from the underlying surface during washing. Further, the durable surface is preferably impervious to the washing step that is required to remove the protective cover 90.

In a preferred embodiment of the invention, the protective cover 90 comprises a film of sputtered material. Sputtered protective cover 90 offer a number of advantages. For example, they are deposited within a controlled sputtering environment. Thus, they provide protection against contamination as soon as the covered substrate is removed from the sputtering chamber. Further, the thickness of a sputtered protective cover 90 can be controlled with a great deal of accuracy and uniformity, thus assuring that the substrate will be uniformly protected. Similarly, protective cover 90 that are substantially non-porous, and hence provide desirable protection against contamination, can be readily formed by sputtering. Surprisingly, it has been discovered that sputtered cover 90 provide effective protection against surface contamination at thicknesses, as small as, 10 angstroms. However, tempered substrates are preferably be provided with slightly thicker cover 90 (e.g., at least about 25 angstroms).

As noted above, the cover 90 can be advantageously formed of a sputtered metal oxide film. A sputtered metal oxide film can be deposited using various sputter deposition processes. One possibility for depositing such a film would be to sputter a target formed of the desired metal oxide itself in a non-reactive atmosphere, such as argon. However, targets formed of metal oxide tend not to sputter as reliably as pure metal targets, since metal oxides are less conductive than their respective metals. Thus, it can be difficult to reliably sputter a metal oxide target in a DC sputtering apparatus. As a consequence, metal oxide films are more commonly deposited by sputtering a metallic target in an oxidizing atmosphere. For example, a protective film 90 of zinc oxide can be deposited by sputtering a zinc target in an oxidizing atmosphere (e.g., oxygen at a pressure of about $8 \times 10^{-3}$ mbar).

Thus, in a particularly preferred embodiment, the protective cover 90 is formed by sputtering a metallic target in an oxidizing atmosphere. As will be readily appreciated by those skilled in the present art, the sputtering atmosphere can be varied to achieve the desired sputtering rate. For example, while the sputtering atmosphere may consist of pure oxygen, this is certainly not a requirement. In fact, a mixture of oxygen and inert gas may enhance the sputtering rate. Thus, it is believed to be advantageous to employ a sputtering atmosphere comprising oxygen and up to about 40% argon (preferably between 0–20%). As will be readily appreciated by the those skilled in the art, the power applied to the sputtering target can be varied to control the sputtering rate and reduce arcing.

One manufacturing arrangement that has given good results utilizes a single planar target formed of metallic zinc. The target is sputtered at a power level of about 12 kW in a sputtering atmosphere comprising 100% $O_2$. The glass is moved past the sputtering target at a rate of about 300 inches per minute.

Figure 3:
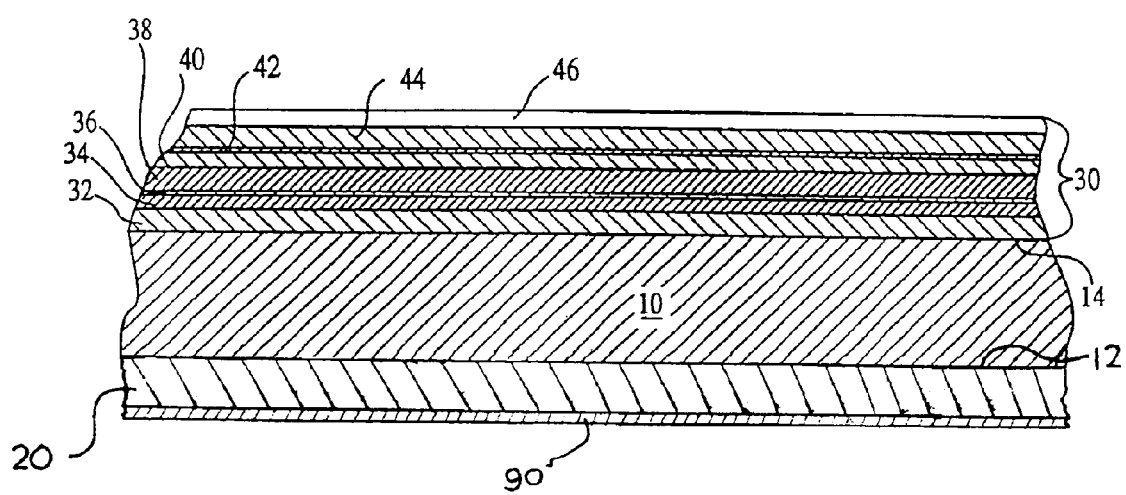
FIG. 3 is a schematic cross-sectional view of a substrate having two coated surfaces one of which carries a temporary cover in accordance with still another embodiment of the invention.

FIG. 3 illustrates another embodiment of the present invention, wherein a substrate 10 is provided with both an exterior coating 20 and a temporary protective cover 90 on one side 12, and a reflective coating 30 on the other 14. The exterior coating 20 in this embodiment can be any desired type of coating. For example, it may be a hydrophilic or photocatalytic coating, advantageously of the preferred types described above, or any other coating that imparts desired properties in the substrate. Moreover, this exterior coating 20 is optional and may be omitted, if so desired.

As those skilled in the present art will appreciate, the reflective coating 30 can take any desired form depending on the intended properties. For example, if the coated article is to be used as a mirror, then the reflective coating 30 may simply comprise one or more relatively thick layers of a reflective metal (although a particularly preferred multilayer coating 30 is illustrated). A wide variety of reflective films are known in the art and the precise nature of such reflective coatings is beyond the scope of the present disclosure.

The particularly preferred embodiment illustrated in FIG. 3 provides a very useful reflective coating 30 that may be typified as an infrared-reflective coating (e.g., of the type commonly used as a low-emissivity coating). Typically, these coatings comprise a metal layer sandwiched between a pair of dielectric (e.g., metal oxide or metal nitride) layers. This structure can be repeated to further enhance the infrared-reflective properties of the film stack. One example of a useful infrared-reflective film stack is disclosed in U.S. Pat. No. 5,302,449, issued to Eby et al., the entire teachings of which are incorporated herein by reference.

The reflective coating 30 illustrated in FIG. 3 includes a base coat 32 which may comprise one or more layers of dielectric materials. For example, this base coat 32 may comprise zinc oxide applied at a thickness of between about 150 angstroms and about 275 angstroms. A first metal layer 34 can be applied directly on top of this base coat 32. This metal can be, for example, silver applied at a thickness of between about 100 angstroms and about 150 angstroms. A second dielectric layer 38 can be applied over the first metal layer 34. The thickness of this dielectric layer 38 will depend, at least in part, on whether a second metal layer 40 will be included in the film stack. In a film stack having two metal layers, as shown, this second dielectric layer 38 may typically comprise a relatively thick layer of a metal oxide, such as 700–750 angstroms of zinc oxide. Preferably, a relatively thin protective layer 36 is applied between the metal layer 34 and the dielectric layer 38. This will help protect the metal layer 34 during sputter deposition of the dielectric layer 38. The protective layer 36 may, for example, comprise a layer of metallic titanium or niobium applied at a thickness of 25 angstroms or less.

In the embodiment of FIG. 3, a second metal layer 40 is applied over the second dielectric layer 38. The second metal layer 40 will usually be made of the same material as the first metal layer 34. For example, this second metal layer 40 may comprise between about 125 angstroms and about 175 angstroms of silver. A second protective layer 42 of titanium, niobium, or the like having a thickness of less than about 25 angstroms is preferably applied over this metal layer 40. As noted above, this layer 42 is provided to protect the metal layer during subsequent deposition of the overlying dielectrics 44 and 46. A third dielectric layer 44 is applied over the protective layer 42. This dielectric layer 44 can also be metal oxide or metal nitride, e.g., zinc oxide having a thickness of between about 250 angstroms and about 300 angstroms. If so desired, an outer layer 46 of a protective (i.e., mechanically and/or chemically durable) material can be applied over this dielectric layer 44. In one preferred embodiment, this layer 46 comprises a film of $Si_3N_4$ having a thickness of between about 50 angstroms and about 60 angstroms.

The reflective coating 30 on the interior surface 14 of the substrate 10 illustrated in FIG. 3 does not carry a protective cover 90. If so desired, however, a protective cover 90 can be applied over this reflective coating 30. Thus, a further embodiment of the invention (not shown) involves a substrate 10, such as that illustrated in FIG. 3, that carries a protective cover 90 over the reflective coating 30 on the interior surface 14 of the substrate 10.

A substrate like that shown in FIG. 3 is well suited for use in low-emissivity articles. For example, a substrate of this nature is commonly incorporated into a multiple-pane insulating glass unit (i.e., an IG unit). IG units are well known in the present art and need not be discussed in great detail. Briefly, though, an IG unit generally comprises two or more panes (e.g., of glass) held in a spaced-apart relationship by a spacer. The spacer 101 is typically formed of a hollow tube of metal or plastic. The spacer 101 can optionally be provided with a desiccant 103 that is allowed to communicate with the gas in the between-pane space 115. Such desiccant is useful in removing moisture that may permeate between the panes. An edge seal 105 can be applied around the external periphery of the spacer to form a gas and moisture barrier. For example, the edge seal 105 commonly comprises silicone which, as noted above, can outgas for extended periods of time. It can thus be appreciated that the presence of these edge seals 105 can present a very intimate contamination source for the panes 10, 100 of an insulating glass unit.

Figure 4:
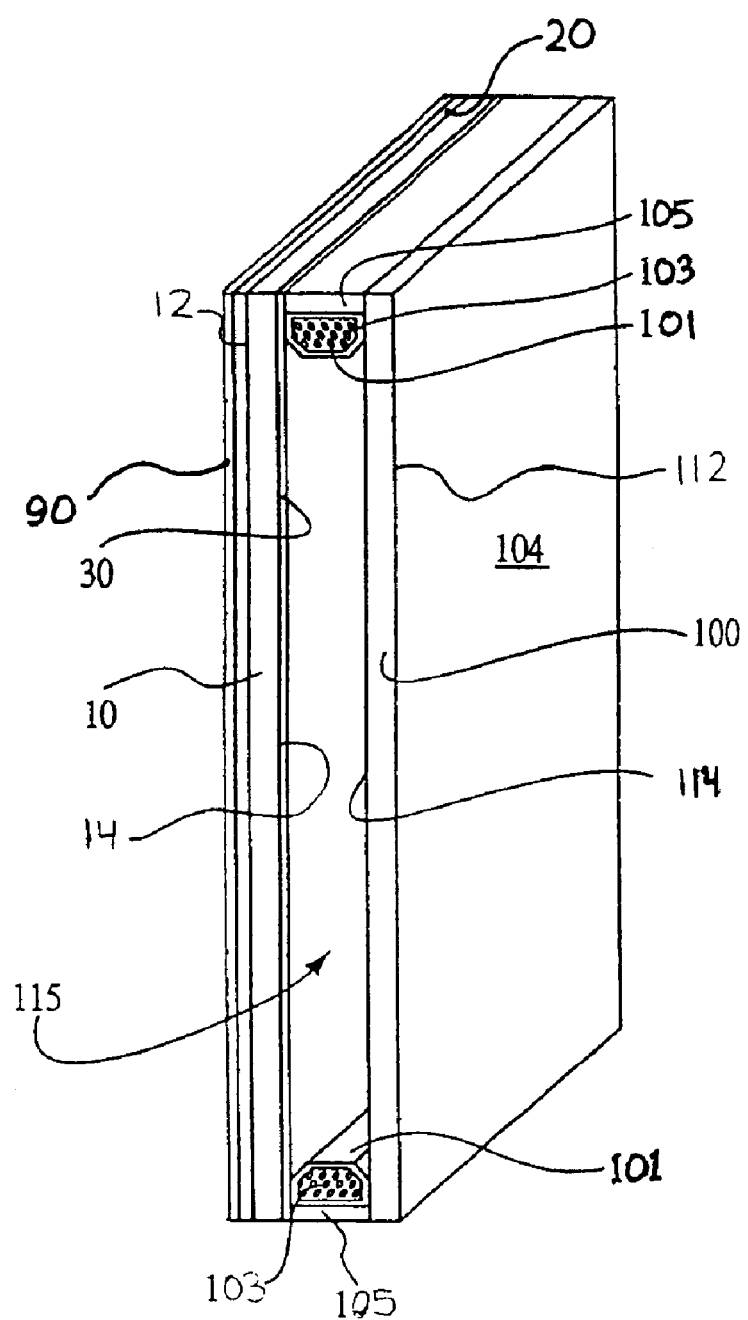
FIG. 4 is a schematic cross-sectional illustration of a multiple-pane insulating glass unit wherein a coated surface of one of the panes carries a temporary cover in accordance with yet another embodiment of the invention.

FIG. 4 illustrates an IG unit wherein the confronting interior surfaces 14, 114 of two spaced-apart panes 10, 100 bound between them a sealable between-pane space 115. As is common with low-emissivity IG units, one of the protected interior surfaces bears an infrared-reflective coating 30. In the illustrated embodiment, the reflective coating 30 is borne on the interior surface 14 of the external pane 10. In this embodiment, the exterior surface 12 bears a durable exterior coating 20 carrying a temporary protective cover 90. The durable coating 20 can be a hydrophilic coating, a photocatalytic coating, or any desired type of coating. While only one 12 of the exterior surfaces 12, 112 of the illustrated IG unit bears an exterior coating 20 and a protective cover 90, both of these surfaces 12, 112 could be provided with any desired coating 20 and/or a protective cover 90, if so desired. For example, it may be desirable to provide the exterior surface 112 of the internal pane 100 with a protective cover 90, even if such surface 112 is not provided with any coating.

FIG. 5 illustrates an embodiment wherein there is provided a substrate 10 having a first coating 20 on its exterior surface 12 and a second coating 20 on its interior surface 14.

If so desired, both coatings 20 could be hydrophilic coatings. This would be particularly desirable where both surfaces 12, 14 of the substrate 10 are destined for exposure to periodic contact with water. For example, this would be the case where both surfaces will be exposed to an outdoor environment. Alternatively, both of these coatings 20 could be photocatalytic coatings. As still another alternative, one of these coatings 20 could be a hydrophilic coating and the other could be a photocatalytic coating.

In the embodiment of FIG. 5, both of the coatings 20 on the substrate 10 carry temporary protective covers 90. Thus, if either covered surface were to become contaminated, then the contaminated cover 90 could be readily removed to reveal the pristine surface of the underlying coating 20. If so desired, however, one of the protective cover 90 on a substrate 10 like that shown in FIG. 5 can be omitted. In such an embodiment (not shown), only one of the coatings 20 would be provided with a protective cover 90.

Figure 6:
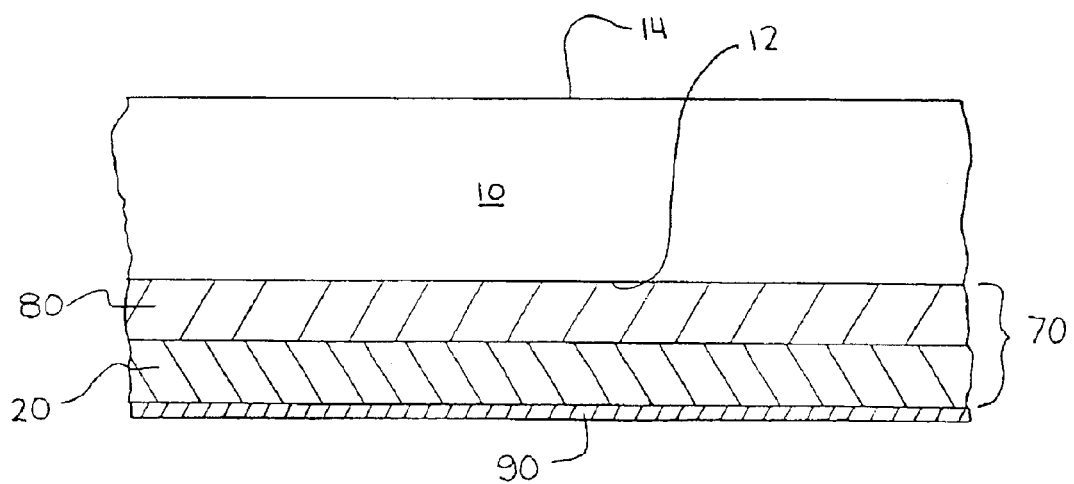
FIG. 6 is a is a schematic cross-sectional view of a substrate having a coated surface carrying a temporary cover in accordance with another embodiment of the present invention.

In the embodiment of FIG. 2, the substrate 10 bears a durable exterior coating 20 directly upon its exterior surface 12. As noted above, however, this is not a requirement. For example, the exterior coating 20 can alternatively be deposited over one or more films (of any desired type and nature) previously deposited on the exterior surface 12 of the substrate 10. FIG. 6 illustrates one embodiment of this nature wherein an exterior coating 20 is deposited over a previously deposited low-emissivity layer 80. The resulting multi-layer coating, which is designated by the reference numeral 70, is also provided with a protective cover 90. In this embodiment, a low-emissivity first layer 80 is formed directly upon the exterior surface 12 of the substrate 10, and an exterior second layer 20 is formed directly upon the low-emissivity first layer 80. The exterior coating 20 in the illustrated embodiment can be any desired coating type. However, in a particularly advantageous embodiment, the exterior coating 20 is a hydrophilic coating. As is thoroughly discussed in U.S. patent application Ser. No. 09/868,543, the entire teachings of which are incorporated herein by reference, a thus coated substrate can be used quite advantageous as a car windshield.

The low-emissivity first layer 80 desirably comprises a pyrolytically-applied dielectric layer. This pyrolytic layer is preferably applied directly upon the exterior surface 12 of the substrate 10. This pyrolytic layer can be formed of any desired material that yields a sufficiently durable coating with a commercially acceptable emissivity reduction as compared to plain, uncoated glass. The low-emissivity first layer 80 shown in the embodiment of FIG. 6 is formed by a single layer of material. It is to be understood, however, that this low-emissivity layer 80 can alternatively take the form of a film stack having multiple individual layers. A variety of pyrolytic low-emissivity coatings are well known in the art and a thorough teaching of all pyrolytic coating techniques and compositions is beyond the scope of the present disclosure.

A number of pyrolytically-applied coatings and techniques for their deposition have been well known in the art for a number of years and are described in public literature. One suitable pyrolytically-applied low-emissivity film is a pyrolytic tin oxide that is commercially available under the trade name Energy Advantage from Libbey Owens Ford of Toledo, Ohio, U.S.A. While the exact coating in the Energy Advantage product is not fully known, it is believed that any of the widely-known techniques for pyrolytically applying tin oxide, for example, will yield a suitable layer.

A number of dopants are known in the art to enhance the conductivity, and hence improve the emissivity, of pyrolytically-applied layers such as tin oxide. For example, fluorine may be the most common such dopant. One manner of applying a fluorine-doped pyrolytic tin oxide coating is detailed in U.S. Pat. No. 5,698,262 (Soubeyrand et al.), the entire teachings of which are incorporated herein by reference. While the reader is referred to this patent for a highly detailed explanation of such a coating, the disclosure of this patent is summarized briefly herein. Generally, the tin oxide is applied by chemical vapor deposition (or "CVD"), wherein selected reactants are combined to form a uniform, vaporized reactant stream that is delivered to the surface of a hot glass substrate. The vaporized reactant stream reacts to deposit a coating of fluorine-doped tin oxide on the surface of the hot glass substrate. In the oxidizing atmosphere that exists at the surface of the hot glass, the organotin coating compounds pyrolytically decompose to form the tin oxide coating.

CVD pyrolytic deposition is typically conducted during the manufacture of glass by the float glass process, and occurs in a float metal bath, a lehr, or in a transition zone between a bath and a lehr. The glass substrate is generally provided at a temperature in the range of between about 7500° F. to about 15000° F. These are typical temperatures for glass during the various stages of manufacturing float glass.

The CVD reactant stream used by Soubeyrand et al. to deposit the tin oxide includes an organotin coating compound that is vaporized and conveyed to a point at or near the surface of the advancing glass ribbon. Suitable organotin compounds are identified as including dimethyltin dichloride, diethyltin dichloride, dibutyltin diacetate, tetramethyl tin, methyltin trichloride, triethytin chloride, trimethyltin chloride, ethyltin trichloride, propyltin trichloride, isopropyltin trichloride, sec-butyltin trichloride, t-butyltin trichloride, phenyltin trichloride, carbethoxyethyltin trichloride, and the like, as well as combinations thereof. Soubeyrand et al. indicate a preference for dimethyltin dichloride. The organotin compound, and optionally a carrier gas, oxidizer, stabilizer, hydrocarbon, inert gas, and the like are said to be vaporized to form a gaseous organotin reactant stream.

Soubeyrand et al. explain that the vaporized organotin compound can be prepared by any of the procedures set forth in U.S. Pat. Nos. 3,852,098; 2,780,553; 4,351,861; 4,571,350; 3,970,037; 4,212,663; and 4,261,722, the entire teachings of each of which are incorporated herein by reference. Soubeyrand et al. state that they prefer to prepare the reactant stream containing the vaporized organotin compound by vaporizing the compound in a thin film evaporator in the presence of a blend gas, as is disclosed, for example, in U.S. Pat. No. 5,090,985, the entire teachings of which are also incorporated herein by reference. This gaseous stream, which generally comprises an inert carrier gas such as helium, nitrogen, or argon, or mixtures thereof, can optionally contain oxidizers such as water or oxygen. Preferred carrier gases are said to be helium and nitrogen, and mixtures thereof, containing oxygen as an oxidizer. The resultant reactant stream containing the vaporized organotin compound is generally heated to a temperature from about 250° F. to about 450° F., then conveyed to the reaction zone at the surface of the hot glass substrate.

Gaseous hydrogen fluoride or hydrofluoric acid ("HF" is used herein to refer to either hydrogen fluoride gas or hydrofluoric acid) is combined with the vaporized organotin compounds. Soubeyrand et al. create a separate HF-containing reactant stream generally comprised of HF and a carrier, preferably water vapor. The addition of water to the HF-containing reactant stream is said to lower the emissivity of the coated glass, while increasing the growth rate of the fluorine doped tin oxide deposited. The HF-containing reactant stream may additionally contain conventional adjuvants such as for example helium, nitrogen, or argon, and mixtures thereof, as well as oxidizers such as for example oxygen.

The HF-containing reactant stream is combined with the organotin reactant stream at a point prior to delivery of the reactants to the surface of the hot glass substrate upon which the coating is to be deposited, but preferably in relatively close proximity thereto. The reactant stream containing the HF can be prepared by vaporizing the compound using one of the methods discussed hereinabove relative to the vaporization of the organotin, or by providing the HF as a gas. The vaporized reactant stream containing the HF can be combined with the reactant stream containing the vaporized organotin compound by blending the two gaseous streams prior to delivery to the surface of the hot glass substrate. Alternatively, the HF-containing reactant stream in liquid or solution form can be injected into the hot reactant stream containing the vaporized organotin compound, thereby vaporizing the fluorine-containing solution or liquid compound. After combination, the vaporized reactants of organotin, HF, water and oxygen are delivered to the surface of the hot glass, where they react together to deposit thereon a coating of fluorine doped tin oxide.

Soubeyrand et al. teach exemplary gaseous reactant mixtures which are delivered to the surface of the hot glass substrate as including (all percentages being mole %) from about 10% to about 60% oxygen, from about 2% to about 50% water, and from about 0.2% to about 2% HF, and most preferably includes from about 30% to about 50% oxygen, from about 15% to about 35% water, and from about 0.5% to about 1.5% HF. The uniform, gaseous reactant mixture also includes an organotin compound, the desired concentration of which is a function of the desired thickness of the tin oxide coating and the line speed of the substrate. Thus, Soubeyrand et al. provide the organotin in the gaseous reactant mixture in an amount sufficient to apply a coating of the desired thickness at the desired line speed of the substrate. For typical commercial operations, the gaseous reactant mixture will generally include from about 0.01% to about 8% of the organotin.

Soubeyrand et al. also teach that it is desirable to apply a layer of a material that acts as a sodium diffusion barrier between the exterior surface of the sheet of glass and the fluorine-doped tin oxide coating. They found that coated glass articles exhibited lower emissivity, lower sheet resistance, and lower haze when the fluorine-doped tin oxide coating was applied to the glass with a sodium diffusion layer therebetween, as opposed to directly on the glass. This sodium diffusion layer is preferably formed of silicon dioxide. The layer of silicon dioxide is preferably formed using conventional CVD techniques.

In Soubeyrand et al.'s preferred embodiment (which is incorporated as the pyrolytic stack 25 shown in their FIG. 1), a thin film of tin oxide is first deposited on the exterior surface of the hot glass substrate, with a thin film of silicon dioxide deposited thereover, so that an underlayer structure of tin oxide/silicon dioxide is formed intermediate the glass and the subsequently deposited layer of fluorine-doped tin oxide. Soubeyrand et al. indicate that the silicon dioxide film not only acts as a sodium diffusion barrier but, in combination with the first (undoped) tin oxide film, helps to suppress iridescence in the resulting coated glass article. The use of such "anti-iridescent" layers is disclosed in U.S. Pat. No. 4,377,613, the entire teachings of which are also incorporated herein by reference.

As illustrated in FIG. 6, the exterior coating 20 is desirably, though not necessarily, deposited directly upon the outer face of the low-emissivity first layer 80. As noted above, the exterior coating 20 in this embodiment may comprise any desired type of coating. In cases where this coating 20 is a hydrophilic coating, the preferred water-sheeting coating described above is expected to function particularly well in connection with pyrolytically-applied low-emissivity layers. In such cases, the hydrophilic coating is desirably applied over the low-emissivity first layer 80 by sputtering, as described above. For example, the outer face of the low-emissivity first layer 80 can be positioned beneath one or more silicon targets in an oxidizing sputtering atmosphere, and the targets can be sputtered to deposit silicon dioxide directly upon the low-emissivity first layer 80. As noted above, the precise operating conditions under which the hydrophilic coating 20 is applied can be varied as necessary to control deposition of the coating 20 at a desired thickness. The thickness of this coating 20 can be on the same order as the hydrophilic coating 20 in the embodiment of FIG. 2. For example, a preferred thickness range is between about 15 angstroms and about 350 angstroms, more preferably between about 15 angstroms and about 150 angstroms, and perhaps optimally between about 20 angstroms and about 120 angstroms. Given the present teaching as a guide, one of ordinary skill in the present art would be able to readily select and vary suitable operating conditions to deposit this coating 20 at different thicknesses.

Alternatively, the exterior coating 20 on a substrate 10 like that shown in FIG. 6 can be a photocatalytic coating. In such cases, the photocatalytic coating 20 can be deposited by positioning the outer face of the low-emissivity first layer 80 beneath one or more titanium-containing targets, and sputtering such targets in an atmosphere comprising argon, oxygen, or a mixture of oxygen and argon, as described above.

In the embodiment of FIG. 6, the interior surface 14 of the substrate 10 does not carry a temporary protective cover 90. However, this interior surface 14 can be provided with a protective cover, if so desired. Thus, in a further embodiment (not shown), a substrate 10 like that shown in FIG. 6 has a first cover 90 carried by the multi-layer coating 70 on its exterior surface 12, and a second cover 90 on its uncoated interior surface 14.

Further, the interior surface 14 of the substrate 10 shown in FIG. 6 is uncoated. It may be desirable, however, to provide the interior surface 14 of a substrate 10 of this nature with a coating 20 of some type. For example, it may be desirable to provide this surface with a hydrophilic coating, a photocatalytic coating, or another coating that imparts desired properties in the substrate. The interior surface 14 may alternatively, or additionally, be provided with a reflective coating 30, which can take any desired form depending on the properties intended for the coated substrate. It can, for example, be an infrared-reflective coating 30, optionally carrying its own protective cover, of the nature discussed above with reference to the embodiment of FIG. 3. A thus coated substrate would likely provide particularly low-emissivity, although visible transmittance and reflectance may not be ideal for some applications.

If so desired, the present cover 90 can be bonded directly to window frames, window sashes, or the like. To the contrary, existing paper, plastic, and polymeric protective coatings may not be well suited for such bonding. For example, the peripheral areas of protective papers and plastics may need to be cut away or otherwise removed before being bonded to a window frame or the like. For example, it has been observed that a protective paper or plastic may deteriorate over time, potentially leaving an installed pane carrying such paper or plastic loose in the surrounding frame. To the contrary, protective cover 90 of the present invention are not expected to create these problems.

Figure 9:
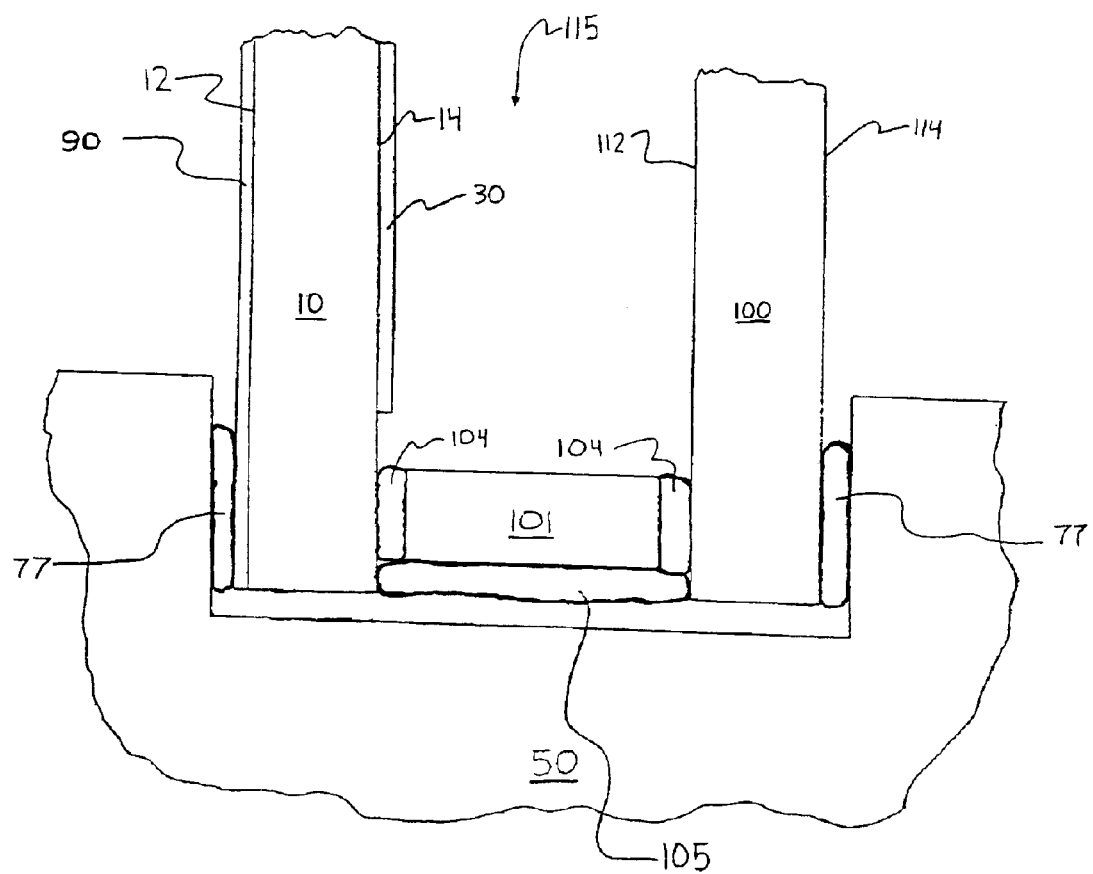
FIG. 9 is a cross-section illustration of a window assembly in accordance with a further embodiment of the invention.
Figure 10:
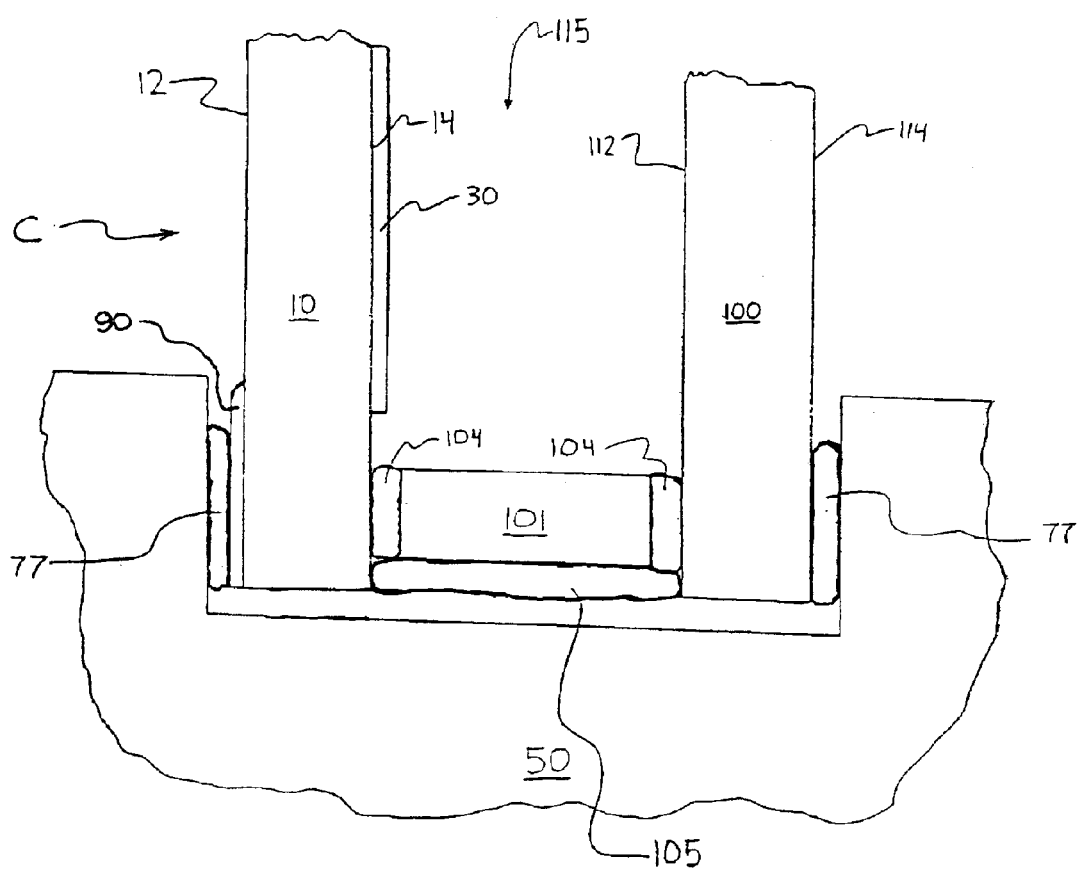
FIG. 10 is a cross-section illustration of a window assembly in accordance with another embodiment of the invention.

FIGS. 9 and 10 illustrate embodiments wherein there is provided a window assembly comprising a window pane 10 having an exterior surface 12 that is durable to a selected washing fluid, such as a mild acid or a mild base. The exterior surface 12 carries a temporary protective cover 90 comprising a sputtered film that can be readily removed by washing with the selected washing fluid. The cover 90 is of the type and nature described herein. Thus, in one embodiment, the cover 90 comprises a sputtered film that is stable in the presence of water but breaks down in the presence of a mild acid or a mild base.

The window assembly in the embodiments of FIGS. 9 and 10 include a frame structure 50 (e.g., a window frame, sash, or the like) to which the window pane 10 is secured. While the illustrated frame structure 50 is very basic, any desired frame structure (including a simple casing over the peripheral edge of a pane or IG unit) can be used. The pane 10 is secured to the frame 50 by a bead of sealant 77 applied directly to the protective cover 90 on the pane 10. The bead of sealant 77 is bonded on a first side directly to a peripheral portion of the protective cover 90, which peripheral portion lies over a peripheral region of the pane's exterior surface 12. Thus, the periphery of the cover 90 does not need to be removed prior to installation of the panel 10. Rather, it can be left permanently bonded to the sealant 77, which in turn can be left permanently bonded to the frame 50. The sealant 77 is bonded on a second side to the frame 50 (or to another structure or member that is secured to the frame).

As is perhaps best appreciated with reference to FIG. 10, a covered substrate 10 can be installed in a frame 50 and, optimally after the frame or other surroundings have been finished (e.g., painted), the cover 90 can be removed from a central region C of the pane's exterior surface 12. The peripheral portion of the cover 90 can thus be left on the pane 10 and bonded permanently to the bead of sealant 77. This would be advantageous as it would obviate the need for the protective cover 90 to be edge deleted prior to installation of the pane 10.

The invention extends to a number of novel methods for producing substrates. For example, in one method of the invention, there is provided a substrate having generally opposed interior 14 and exterior 12 surfaces, which surfaces are typically major surfaces. A durable coating 20 is formed upon the exterior surface 12 of the substrate 10. As noted above, the durable coating 20 preferably comprises material that is durable to a selected washing fluid. In one embodiment, the coating 20 is formed of material that is resistant to attack by a weak acid or a weak base. If so desired, the coating 20 can be a hydrophilic coating. The hydrophilic coating 20 may be formed directly upon the substrate, although this is certainly not required. In a particularly preferred embodiment, the hydrophilic coating 20 is formed by sputtering silicon dioxide upon the substrate 10. For example, this can be accomplished by sputtering a silicon target in an oxidizing atmosphere, as has been described. Alternatively, the coating 20 may be a photocatalytic coating which, as described above, can be deposited by sputtering a titanium-containing target. A temporary protective cover 90 can then be formed upon the durable coating 20. The cover 90 preferably comprises material that breaks down in the presence of a weak acid or a weak base, as noted above. In one embodiment, the cover 90 is formed of material that is durable to elevated temperatures on the order of 600 degrees C., and the method further comprises tempering the covered substrate. In a preferred embodiment, the cover 90 is formed by sputtering upon the exterior coating 20 an oxide of a metal selected from the group consisting of bismuth, cadmium, iron, nickel, and optimally zinc.

In another aspect, the method further comprises incorporating the covered substrate into an IG unit, as described above. In still another aspect, the method further comprises delivering the covered substrate to a customer. In yet another aspect, the method further comprises installing the covered substrate in a window frame, which may optionally then be installed in the wall of a building.

The invention also extends to methods of processing substrates. For example, in one method there is provided a substrate having an exterior surface that is durable to a selected washing fluid (e.g., a mild acid or a mild base). The exterior surface carries a temporary protective cover 90, which may advantageously comprise a sputtered film that protects the exterior surface against contamination, but that can be readily removed from the exterior surface by washing with the given washing fluid. As noted above, the selected washing fluid may be a mild acid or a mild base. The cover 90, for example, can be formed of material that is removable upon being washing with a household vinegar, such as would commonly have a pH of about 3. The protective cover 90 can be removed from the exterior surface whenever it is desired to expose this surface. The covered substrate can, for example, be provided by a manufacturer of IG units or windows, by a distributor, by a home or building owner, or by a builder or contractor preparing to install the covered substrate in its final position (such as in a wall of a building).

The present method comprises washing the covered exterior surface of the substrate with the given washing fluid to remove at least a portion of the cover 90, thereby exposing at least a portion of the underlying surface. Preferably, substantially the entire cover 90 is removed by this washing. This washing step can be performed using any conventional washing technique. For example, the covered exterior surface can be washed with a towel or the like that has been moistened or soaked with the desired washing fluid (which may be a mildly acidic or mildly basic solution) in much the same way that the average homeowner cleans windows. Alternatively, it would likely be possible to remove the cover 90 by washing the covered exterior surface with a conventional squeegee device in conjunction with the desired washing fluid.

The washing step can be performed whenever it is desired to expose the surface beneath the cover 90. For example, it will generally be preferable not to remove the protective cover 90 until after the substrate has left the manufacturing facility, which is likely to be a contaminant-rich environment. As noted above, the substrate may be exposed to a variety of contamination sources even after leaving the manufacturing environment. For example, panes that are assembled into an IG unit are typically exposed quite intimately to silicone sealants and the like, which are commonly applied during IG unit assembly. In such cases, the cover 90 can be advantageously left on the substrate 10 until the substrate 10 has been assembled into an IG unit or some other assembled product. In fact, it may be preferable to perform the washing step after the covered substrate has been delivered to an installation site or to the ultimate consumer (e.g., a homeowner). In some cases, the washing step may be performed following installation of the covered substrate in a position wherein the covered exterior surface is oriented toward an outdoor environment. In such cases, the washing step will expose the exterior surface to periodic contact with water. It may be more preferable not to perform the washing step until the covered substrate has been installed in its final position (e.g., in window frame which may optionally be mounted in the wall of a building). Perhaps optimally, the washing step is not performed until any finishing procedures (e.g., painting a surrounding frame) have been completed on the substrate or its surroundings. By removing the protective cover 90 at such a late stage, the covered exterior surface can be protected against contamination during manufacturing, storage, transport, installation, and finishing. Thus, it is anticipated that it will be most preferred to perform the washing step, and thereby remove the cover 90, from the substrate 10 after all installation and finishing procedures have been completed.

As noted above, the temporary protective cover 90 is desirably applied by sputtering. Likewise, the exterior coating 20 and the infrared-reflective coating 30, if either or both are present, are preferably applied by sputtering. As described above, certain embodiments of the invention involve a substrate bearing coatings on both major surfaces (i.e., on the interior and exterior surfaces). In these embodiments, both coatings (i.e., the interior and exterior coatings) can be deposited using conventional sputtering equipment by applying these coatings in separate passes through a sputtering line.

In one method of the invention, before an infrared-reflective coating 30 is sputtered onto the interior surface 14 of a substrate 10, an exterior coating 20 and a protective cover 90 are sputtered onto the exterior surface 12 of the substrate 10. This can be accomplished by positioning the exterior surface 12 of the substrate 10 beneath one or more targets adapted to sputter the desired exterior coating 20 material. For example, if the exterior coating 20 is a hydrophilic coating, then such target or targets may be silicon targets, as described above. Alternatively, if the exterior coating 20 is a photocatalytic coating, then such target or targets may be titanium-containing targets, as described above. The target or targets can then be sputtered to deposit the desired exterior coating 20 upon the exterior surface 12 of the substrate 10. Thereafter, the outer face of the exterior coating 20 can be positioned (e.g., conveyed to a subsequent sputtering chamber) beneath one or more targets (e.g., zinc targets) adapted to sputter the desired protective cover 90 material (e.g., zinc oxide). The target or targets can then be sputtered (e.g., in an oxidizing atmosphere) to deposit the protective cover 90 upon the outer face of the exterior coating 20. Next, the interior surface 14 of the substrate 10 can be positioned beneath one or more targets adapted to sputter the film or films of the infrared-reflective coating 30. These targets can then be sputtered to deposit the infrared-reflective coating 30 upon the interior surface 14 of the substrate 10. Of course, the order of deposition can be reversed (i.e., the infrared-reflective coating 30 can be deposited on the interior surface 14 prior to depositing the exterior coating 20 and the cover 90 on the exterior surface 12), if so desired.

Figure 7:
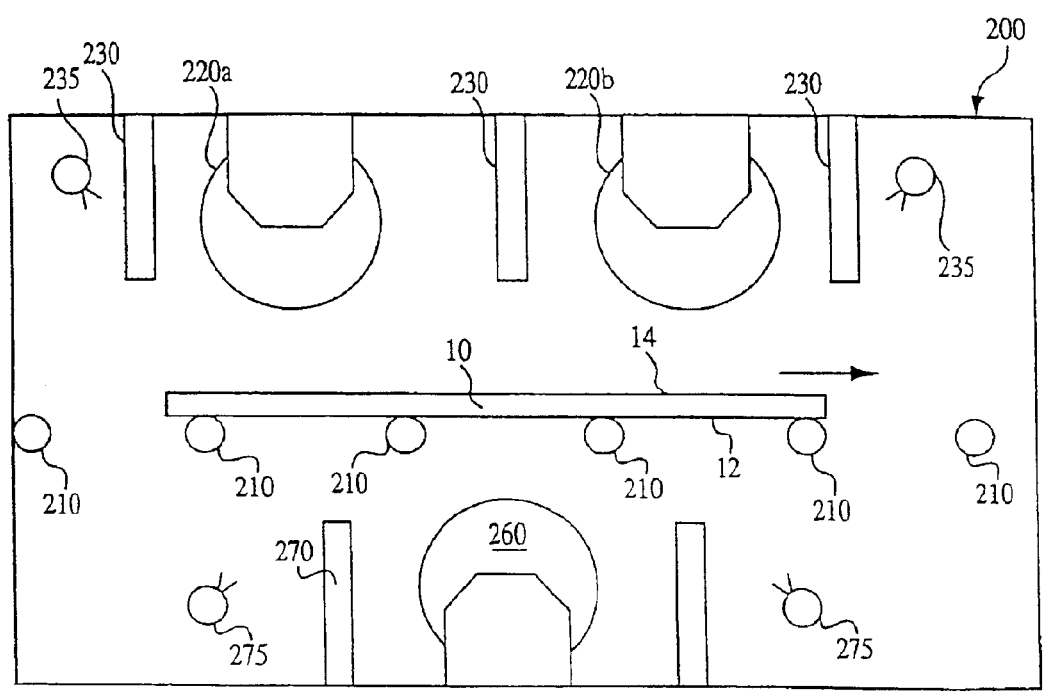
FIG. 7 is a schematic illustration of a dual-direction sputtering chamber for use in accordance with one method of the invention.

FIG. 7 schematically illustrates a dual-direction sputtering chamber in accordance with one embodiment of the present invention. As noted above, magnetron sputtering chambers are well known in the art and are commercially available from a variety of sources. Thus, a detailed discussion of conventional magnetron sputtering chambers is beyond the scope of the present disclosure. In FIG. 7, the substrate 10 to be coated is positioned on a plurality of support rollers 210. The rollers 210 are spaced along the length of the sputtering chamber 200. While the precise spacing of these rollers 210 can be varied, for reasons explained more fully below, it may be desirable to space these rollers a little bit farther apart, along at least an interim length of the chamber 200, to increase the effective coating area from the lower target 260.

In the illustrated embodiment, the substrate 10 is oriented to travel horizontally across the rollers, e.g., from left to right. The interior surface 14 of the substrate 10 is oriented upwardly, while the exterior surface 12 of the substrate is oriented downwardly to rest on (e.g., in direct supportive contact with) the rollers 210. While this is probably the most typical configuration, it will be understood that the relative orientation of the substrate 10 within the sputtering chamber 200 can be switched, and the relative positions of the upper targets 200 and the lower target 260 also reversed. As a consequence, it should be noted that designating these targets as "upper" and "lower" targets is simply for purposes of convenience and the relative orientation of these elements within the sputtering chamber can easily be reversed if so desired.

The sputtering chamber 200 shown in FIG. 7 includes two spaced-apart upper sputtering targets 220*a* and 220*b*. While these targets can be planar targets, they are illustrated as being so-called rotary or cylindrical targets. These targets are arranged generally parallel to one another with a plurality of anodes 230 extending horizontally and generally parallel to these targets. As suggested in U.S. Pat. No. 5,645,699 (Sieck), the entire teachings of which are incorporated herein by reference, an intermediate anode 230 can also be positioned between these two targets.

A gas distribution system is used to supply the sputtering gas to the chamber adjacent the targets 220a and 220b. While a variety of gas distribution systems are known in the art, this distribution system may simply comprise a pair of pipes 235 with a plurality of spaced-apart openings or nozzles oriented generally toward the target.

The use of multiple targets positioned above a substrate in a magnetron sputtering chamber is fairly conventional in the field. The unique aspect of the sputtering chamber 200 in FIG. 7, though, is the presence of the "lower" target 260. Lower targets can be used advantageously to sputter deposit an exterior coating 20 (e.g., a hydrophilic coating, a photocatalytic coating, etc.) upon the exterior surface 12 of the substrate 10, and to subsequently sputter deposit a protective cover 90 upon the exterior coating 20. As described below, upper targets can be used advantageously to deposit upon the interior surface 14 of the substrate 10 a film (e.g., a metal oxide) or films of the infrared-reflective coating 30, if present.

While FIG. 7 illustrates a chamber 200 having only one lower target 260, the chamber 200 can be provided with two (or perhaps more) lower targets, if so desired. As with the upper targets 220a and 220b, the lower target 260 is provided with at least one, and preferably two, anodes 270 in sufficient proximity to establish a stable plasma. The gas distribution pipes 235 shown adjacent the upper targets 220a and 220b are undesirably far from the lower target 260 and the intermittent presence of the substrate 10 will effectively divide the sputtering chamber 200 into two separate functional areas. Accordingly, it is preferred to have separate gas distribution pipes 275 positioned beneath the gas adjacent the lower target 260 to ensure a consistent supply of gas for the plasma adjacent the lower target 260. If so desired, the lower pipes 275 and the upper pipes 235 may be a part of the same gas distribution system, i.e., both sets of pipes can be connected to a single gas supply.

The nature of the gas supplied by the upper 235 and lower 275 pipes will depend at least in part on the composition of the upper 220 and lower 260 sputtering targets. In conventional magnetron sputtering, the target serves as a cathode. As noted above, it can be difficult to reliably sputter many commonly deposited materials, such as oxides of metals and semi-metals, due to their electrically insulating nature. As a result, it is preferable in such cases to sputter targets comprising pure metals and/or semi-metals. The material actually deposited can be oxidized by including oxygen in the gas supplied to the sputtering chamber.

While the substrate 10 will somewhat divide the sputtering chamber, this does not preclude gas introduced in one area of the chamber from traveling elsewhere in the chamber. Accordingly, it is preferable that the gas supplied by the lower pipes 275 not adversely affect the sputtering of the upper targets 220a and 220b. Likewise, of course, it is preferable that the sputtering of the lower target 260 not be adversely affected by the presence of the gas supplied through the upper pipes 235. For example, use of this dual-direction sputtering chamber 200 would not be as advantageous when depositing an oxide coating on one side of the glass and an oxygen-sensitive metal on the other side.

More advantageously, a dual-direction sputtering chamber, such as that illustrated in FIG. 7, is used to deposit a first coating on the interior surface 14 of the substrate 10 and a second coating on the exterior surface 12 of the substrate 10 in a single pass through the chamber. For example, first and second hydrophilic coatings 20 could be advantageously deposited upon a substrate 10 like that shown in FIG. 5 in a single pass through such a dual-direction sputtering chamber 200. This could be accomplished by utilizing upper 220a and 220b and lower 260 targets formed of silicon, and sputtering these targets at substantially the same time (e.g., simultaneously) in an oxidizing atmosphere. Similarly, first and second photocatalytic coatings 20 could be advantageously deposited in a similar manner by sputtering upper 220a and 220b and lower 260 titanium-containing targets in an oxidizing atmosphere. A dual-direction sputtering chamber 200 could also be used advantageously to deposit first and second protective cover 90 upon a substrate like that shown in FIG. 5. This could be done by utilizing upper 220a and 220b and lower 260 targets formed of zinc, and sputtering these targets at substantially the same time (e.g., simultaneously) in an oxidizing atmosphere. The oxidizing atmosphere in these methods can be established by introducing oxygen, or a mixture of oxygen and argon, through both the upper pipes 235 and the lower pipes 275. In methods of this nature, any commingling of the gases introduced through the two sets of pipes 235 and 275 should not adversely affect deposition of the interior or exterior coatings.

A dual-direction sputtering chamber 200 like that shown in FIG. 7 can also be used to deposit interior and exterior coatings that differ in composition. For example, a chamber of this nature could be used to deposit a hydrophilic coating 20 and one of the dielectric layers of an infrared-reflective coating 30 on a substrate 10 like that shown in FIG. 3. For example, this could be accomplished utilizing upper targets 220a and 220b formed of a desired metal (e.g., zinc) and a lower target 260 formed of silicon. These targets could then be sputtered at substantially the same time (e.g., simultaneously) in an oxidizing atmosphere. Thus, in a single pass through the chamber, a metal oxide (e.g., zinc oxide) of the infrared-reflective layer 30 could be deposited on the interior surface 14 of the substrate 10 and a hydrophilic coating 20 (e.g., silicon dioxide) could be deposited on the exterior surface 12 of the substrate 10.

Similarly, a dual-direction sputtering chamber 200 could be used to deposit an exterior photocatalytic coating 20 and one of the dielectric layers of an interior infrared-reflective coating 30 on a substrate 10 like that shown in FIG. 3. For example, this could be accomplished utilizing upper targets 220a and 220b formed of a desired metal (e.g., zinc) and a lower titanium-containing target 260. These targets could then be sputtered at substantially the same time (e.g., simultaneously) in an oxidizing atmosphere. Thus, in a single pass through the chamber, a metal oxide (e.g., zinc oxide) of the infrared-reflective layer 30 could be deposited on the interior surface 14 of the substrate 10 and a photocatalytic coating 20 (e.g., titanium oxide) could be deposited on the exterior surface 12 of the substrate 10.

Alternatively, a protective cover 90 and one of the dielectric layers of an infrared-reflective coating 30 on a substrate 10 like that shown in FIG. 3 could be deposited in a single pass through a dual-direction sputtering chamber 200. For example, this could be accomplished utilizing upper 220a and 220b and lower targets formed respectively of the desired metals (e.g., all targets could be zinc). These targets could then be sputtered at substantially the same time (e.g., simultaneously) in an oxidizing atmosphere. Thus, in a single pass through the chamber, a metal oxide (e.g., zinc oxide) of the infrared-reflective layer 30 could be deposited on the interior surface 14 of the substrate 10 and a metal oxide (e.g., zinc oxide) protective cover 90 could be deposited on the exterior surface 12 of the substrate 10.

Even if a dielectric layer of an interior coating (e.g., an infrared-reflective coating 30) comprises a nitride or the like, while an exterior coating (e.g., a hydrophilic or photocatalytic coating 20 or a protective cover 90) comprises a metal oxide, in accordance with one embodiment of the invention, such materials can be simultaneously sputtered in the dual-direction chamber 200, so long as the introduction of some metal oxide into the nitride, and vice versa, being deposited will not adversely affect the coatings being applied. Ideally, though, the coating layer being deposited on the interior surface 14 is an oxide (or a partial oxide) when the coating 20 or protective cover 90 deposited on the exterior surface 12 is a metal oxide. This assures that any commingling of the gases introduced through the two sets of pipes 235 and 275 will not adversely affect the deposition of any of these coatings.

In conventional magnetron sputtering chambers, the spacing of the rollers 210 used to support the substrate is kept fairly small to permit smaller substrates to be processed on the line without any significant risk of having the substrate fall between the rollers. In order to minimize the interference of the rollers in applying the coatings on the exterior surface 12 of the substrate, though, this spacing can be increased.

The maximum safe spacing will need to be determined on a case-by-case basis for a given range of anticipated substrate sizes. However, the larger the spacing between the rollers disposed in the path from the lower target 260 to the exterior surface 12 of the substrate, the greater the percentage of the sputtered material that will be deposited on the substrate. Of course, the rollers in other areas of the sputtering apparatus can be maintained at their normal spacing. It may be desirable to make a few of the rollers in the dual-direction sputtering chamber 200 easily removed so the chamber can be converted from the illustrated configuration to a more conventionally operated chamber coating only one side of the substrate and having rollers spaced more closely together. Instead of changing the spacing between the rollers, the rollers could instead be made smaller in diameter. In order to maintain the same transport speed of the substrate along the support, these smaller-diameter rollers could be turned more rapidly, e.g., by means of a pair of gears having the desired gear ratio.

The rollers 210 can be of any conventional structure. Conventional rollers are hollow metal tubes. If so desired, the rollers can be stiffened, e.g., by filling them with a rigid foam. It has been found that good results can be obtained by employing cylindrical aluminum rollers about which a rope of Kevlar™ is spirally wound, with the Kevlar™ providing the surface with which the substrate is in direct contact.

In some specific applications, the dual-direction sputtering chamber 200 of FIG. 7 will be sufficient to entirely apply the desired interior and exterior coatings. More often, though, the sputtering chamber 200 would be part of a sputtering line comprising a series of sputtering chambers. Each sputtering chamber in the line could include both an upper target and a lower target, but in most conventional applications, the film stack (e.g., an infrared-reflective film stack) applied to the upper surface of the substrate will be more complex (i.e., will comprise a series of distinct layers of varying composition) and thicker than the coating or coatings applied to the lower surface of the substrate. As a consequence, a majority of the chambers in a sputtering line can comprise conventional, downward sputtering chambers having only an upper target, with no target positioned beneath the supports. If the sputtering line comprises a combination of downward sputtering chambers and dual-direction sputtering chambers 200, the position of the dual-direction chambers along the sputtering line can be varied. For example, if a coating 20 or cover 90 comprising an oxide is applied by sputtering a lower target 260 in an oxidizing atmosphere, then one should not attempt to deposit a non-oxidized layer (e.g., an infrared-reflective silver layer such as is conventionally used in low-emissivity film stacks) onto the upper surface of the glass in the same chamber. Accordingly, any chamber used to sputter a pure metal layer is preferably operated as either a downward sputtering chamber or as an upward sputtering chamber, but preferably not as a dual-direction sputtering chamber, by omitting the lower target.

A dual-direction sputtering chamber 200 like that shown in FIG. 7 is believed to minimize the cost and maximize production efficiency in applying coatings to both sides of a substrate. Less desirably, the coatings on the interior side of the substrate (e.g., the low-emissivity film stack) can be applied in one pass, and the coatings on the exterior side of the substrate (e.g., a hydrophilic or photocatalytic coating and a protective cover) can be applied in a second pass, flipping the glass between the passes to permit all of the targets to be positioned on the same side of the supports in the sputtering chamber or line. However, this is believed to be much less efficient than the process outlined above, and is not as advantageous for low-cost commercial substrate production.

As the substrate moves through the chamber, there will be times when the glass does not effectively shield the upper targets 200a and 200b from the lower target 260 or vice versa. As a consequence, material from the upper targets will be deposited on the lower target and material from the lower target can be deposited on one or both of the upper targets. It is ideal to provide the sputtering chamber 200 of FIG. 7 with upper 220a and 220b and lower 260 targets that have substantially the same composition. For example, the upper 220a and 220b and lower 260 targets could all be zinc targets, such that with oxygen or a mixture of oxygen and argon delivered through the upper 235 and lower 275 pipes, a zinc oxide cover 90 can be applied on the exterior surface 12 of the substrate 10 at the same time that a zinc oxide dielectric layer of an infrared-reflective coating 30 is deposited on the interior surface 14 of the substrate 10. If the upper targets have a different composition from the lower target, then cross-contamination of the different targets could conceivably lead to problems in sputtering or in maintaining consistent product quality.

At least in theory, this problem could be overcome by independently controlling the power supplied to each of the sputtering targets to ensure that each target is sputtering only when the substrate is positioned to shield the upper and lower targets from one another. Current commercially available power supply controllers are not configured in this fashion, however. Furthermore, the control logic for such an arrangement can be unduly difficult if the sputtering line is used to coat substrates of varying sizes rather than a consistent size.

Figure 8:
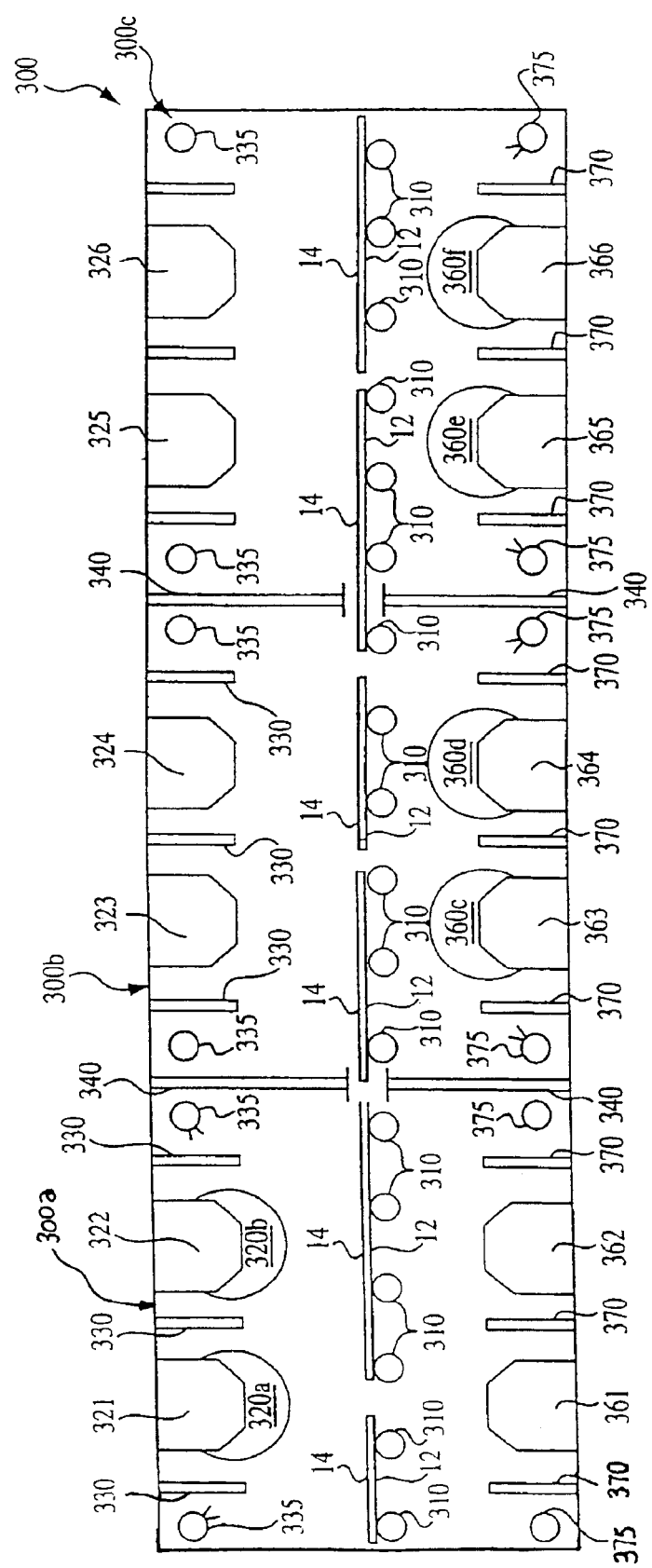
FIG. 8 is a schematic illustration of a multiple-zone dual-direction sputtering chamber for use in accordance with another method of the invention.

FIG. 8 illustrates one possible sputtering chamber 300 that can be used to coat both the interior surface 14 and the exterior surface 12 of a substrate 10 in a single pass without substantial cross contamination of the sputtering targets. Elements serving an analogous function to elements shown in FIG. 7 bear like reference numbers, but indexed by 100, e.g., the upper gas distribution pipes 335 of FIG. 8 are functionally analogous to the upper gas distribution pipes 235 of FIG. 7.

The sputtering chamber 300 of FIG. 8 is effectively divided into three coating zones 300a, 300b and 300c by a pair of barriers 340. Some fraction of the gas in one coating zone may flow into another coating zone, so it is best to use a similar atmosphere in all three zones. However, the barriers 340 serve to effectively limit the amount of material sputtered in one coating zone which lands on a target in another coating zone.

In the embodiment of FIG. 8, each of the three coating zones 300a–300c is adapted to hold up to four targets, with two targets positioned above the substrate and two positioned below the substrate. Hence, there are six upper target mounts 321–326 positioned above the path of the substrate and six lower target mounts 361–366 positioned beneath the path of the substrate. This allows maximum flexibility in using this single multi-zone sputtering chamber 300 to manufacture products having different properties. FIG. 8 schematically illustrates each of the upper target mounts 321–326 vertically aligned with one of the lower target mounts 361–366, respectively. It should be understood, however, that the targets need not be vertically aligned in this fashion and can be more advantageously positioned in a horizontally staggered arrangement. In the configuration shown in FIG. 8, the first coating zone 300a is a downward-sputtering zone, having two upper targets (320a and 320b), but no lower targets on the lower target mounts 361 or 362.

While a sputtering gas should be supplied to the upper gas distribution pipes 335 and power should be supplied to the upper anodes 330 in the first coating zone, there is no need to deliver any gas to the lower gas distribution pipes 375 or any power to the lower anodes 370. The second coating zone 300b is an upward-sputtering zone, having two lower targets 360c and 360d, but neither of the upper target mounts 323 and 324 carry sputtering targets. Similarly, the third coating zone 300c has two lower targets 360e and 360f, but neither of the upper target mounts 325 and 326 carry sputtering targets.

The arrangement of targets in the multiple-zone sputtering chamber 300 of FIG. 8 is merely illustrative and it will be understood that the target arrangement can be varied to maximize production efficiency for different products. For example, if a thick hydrophilic or photocatalytic coating 20 is desired using an established substrate speed, a silicon or titanium-containing target can be mounted on each of the lower target mounts 361–366 while none of the upper target mounts 321–326 can be provided with a target. If a thin hydrophilic or photocatalytic coating 20 will suffice (or if substrate speed through the chamber is suitably reduced), then only the last two lower target mounts 365 and 366 can be provided with targets while each of the first four upper target mounts 321–324 carry sputtering targets. Of course, any one or more of the coating zones 300a–300c can be operated much like the dual-direction sputtering chamber 200 of FIG. 7 by mounting targets in the upper and lower target mounts of the same zone.

The equipment of FIGS. 7 and 8 and the methods of depositing coatings using such coating systems are discussed in the present application primarily in the context of applying an infrared-reflective coating 30 on one side of the substrate 10 and a hydrophilic or photocatalytic coating 20 and/or a protective cover 90 on the other side of the substrate 10. It is to be understood, however, that such equipment and methods can be used to apply any desired coatings to both sides of a substrate regardless of the nature of the coatings applied thereto. For example, the apparatus can be used to apply a protective cover 90 on one side 14 of a substrate 10 and any desired coating 20 (e.g., a hydrophilic coating, a photocatalytic coating, or any other type of coating) on the other side 12 of the substrate 10.

The advantage of the systems illustrated in FIGS. 7 and 8 is that sputtered coating of the same or different composition can be applied to both sides 12, 14 of a substrate 10 in a single pass through the coating apparatus while the substrate 10 is maintained in a constant orientation, i.e. wherein it does not need to be flipped, turned or otherwise manipulated. This enables the use of a simple set of standard transport rollers to move the substrate along the production line. In the absence of the present invention, one typically would have to either manually handle the substrate to flip it and send it back through the coating apparatus in a separate run, or use a complex substrate handling system which must hold the substrate and flip it at some point during the production process. This enables a substrate having coatings on both sides to be produced particularly economically without any loss in coating quality.

In the past, it was assumed that even if one were to coat the bottom side of the substrate, contact with the rollers would mar that coating or and/or damage the bottom surface of the substrate prior to application of the coating. Surprisingly, however, the present invention demonstrates that both sides of the substrate can be coated in a single pass with excellent results.

The precise operating conditions (e.g. target composition, plasma composition, etc.) under which the various coatings of the invention are applied can be varied as necessary to optimize the deposition of the desired coating. Given the present teaching as a guide, one of ordinary skill in the art should be able to select suitable operating conditions to apply a given coating of the invention without undue experimentation.

The following non-limiting experimental examples illustrate the effectiveness of the present temporary cover 90 in protecting substrates against contamination.

A comparative sample was prepared to provide an accurate comparison of a hydrophilic surface carrying a protective cover 90 of the invention to a directly comparable hydrophilic surface without such a cover 90. In the following Examples 1–3, two test samples, designated Sample A and Sample B, were provided. Sample A comprised a sheet of glass bearing a hydrophilic coating. Sample B comprised a sheet of glass bearing the hydrophilic coating of Sample A and carrying a protective cover 90 over the hydrophilic coating.

The glass sheets of Sample A were produced in the following manner. A clean surface of a sheet of soda-lime glass was sputter coated with silicon dioxide in an oxidizing atmosphere comprising 80% oxygen and 20% argon. Three rotary targets each comprising about 95% silicon and about 5% aluminum were operated at a power level of about 100 kW with the glass moving at a rate of about 300 inches per minute. The resulting silicon dioxide coating had a thickness of about 53 angstroms.

The glass sheets of Sample B were produced in the following manner. A clean surface of a sheet of soda-lime glass was sputter coated with silicon dioxide in the same manner as in Sample A. Thereafter, a temporary protective cover 90 comprising zinc oxide was sputtered onto the silicon dioxide coating. The zinc oxide was sputtered from a planar zinc target in an oxidizing atmosphere comprising 100% oxygen. The target was operated at a power level of about 12 kW with the glass moving at a rate of about 300 inches per minute. The resulting zinc oxide covers had a thickness of about 16 angstroms.

EXAMPLE 1

Glass sheets of Sample A and Sample B were placed in a glass processing facility adjacent barrels containing an uncured bulk silicone rubber material. After about six hours of exposure to this environment, the glass sheets of both samples were tested for contamination.

Two different tests were performed to assess the extent to which the coated glass surfaces had become contaminated. In the first test, the contact angle of water on the coated glass surfaces was measured once or twice using a commercially available measuring device. Hydrophilic silicon dioxide coatings deposited under conditions such as those noted above would be expected to have a contact angle with water of well below 25° prior to any environmental exposure. Zinc oxide coatings deposited under conditions such as those noted above would be expected to have a contact angle with water of below about 30° prior to any environmental exposure.

In the second test, the ease of cleaning each sample was assayed by spraying a commercial glass cleaning liquid (Windex®) on the coated surface of each sample. That surface was then manually wiped with a paper towel until the surface appeared to be clean and essentially streak-free. The ease of cleaning (or "wipeability") was assessed on a scale of 1–5, with the ease of cleaning normal uncoated glass (prior to any environmental exposure) being defined as 3, a very easy to clean glass surface being rated 1, and a sample that is substantially more difficult to clean being rated 5. While this rating system is somewhat subjective, it does give a rough qualitative indication of the ease with which a glass surface can be cleaned.

The coated surfaces of both samples were then washed with a common household vinegar. This was done by scrubbing the samples with towels moistened in the vinegar in much the same way that one would ordinarily clean a window. After the vinegar wash, the above tests were again performed on both samples. The results of these tests were as follow:

tive cover 90 (Sample B) exhibited desirable hydrophilic surface properties that would be expected for an uncontaminated silicon dioxide coating of this type. The wipeability of this sample improved from a 2–3 rating to a much better rating of 1, indicating that this sample had become very easy to clean. On the other hand, the vinegar wash had no apparent effect on the wipeability of the hydrophilic coating that was without a cover 90 during exposure (Sample A), as the wipeability of this surface had a mediocre rating of 3 before and after the vinegar wash. Moreover, the contact angle of the sample that carried a cover 90 was reduced to 10°–11°, which is less than half the final contact angle of the sample that was without a protective cover 90.

These results indicate that the hydrophilic surface properties of a desirable silicon dioxide coating carrying a protective cover 90 of the present invention can be returned to a very desirable hydrophilic condition, such as would be expected of an uncontaminated coating of this type, even after the covered surface has become contaminated with silicone. Moreover, these results suggest that it is significantly less effective to attempt to wash this type of contamination from the silicon dioxide coating in the proscribed manner once the coating has been directly exposed to silicone. Further, it is anticipated that washing with any of a variety of liquids would not improve wipeability or reduce contact angles to the same extent as can be achieved with the present covers 90.

TABLE 1

| Sample | Surface | Contact Angle Following Exposure | Wipeability Following Exposure | Contact Angle After Vinegar Wash | Wipeability After Vinegar Wash |
| --- | --- | --- | --- | --- | --- |
| A | without Cover | 43° and 53° | 3 | 23° | 3 |
| B | with Cover | 29° and 50° | 2–3 | 10°–11° | 1 |

Note that, following exposure to the contaminant, the coated surfaces of both samples exhibited greater contact angles than would be expected for such surfaces in an uncontaminated state. While the contact angles of the glass carrying a protective cover 90 of the invention (Sample B) were somewhat lower than those of the glass not carrying a cover 90 (Sample A), neither of the samples exhibited particularly desirable contact angles. Likewise, the wipeability ratings of both samples indicate that, following exposure, neither Sample A nor Sample B would have been particularly easy to clean in the proscribed manner.

After both samples were subjected to the vinegar wash, the silicon dioxide coating that originally carried a protec-

EXAMPLE 2

Glass sheets of Sample A and Sample B were placed in front of a large fan in a glass processing facility. After about six hours of exposure to this environment, the glass sheets of both samples were tested for contamination in the same manner as in Experimental Example 1. The results of these tests were as follow:

TABLE 2

| Sample | Surface | Contact Angle Following Exposure | Wipeability Following Exposure | Contact Angle After Vinegar Wash | Wipeability After Vinegar Wash |
| --- | --- | --- | --- | --- | --- |
| A | without Cover | 40° and 43° | 3–4 | 24° and 32° | 3–4 |
| B | with Cover | 35° and 47° | 3–4 | 15° and 14° | 1 |

As was the case in Experimental Example 1, following exposure, both samples exhibited less desirable wipeability and contact angles than would be expected for uncontaminated surfaces of this nature.

After both samples were subjected to the vinegar wash, the silicon dioxide coating that originally carried a protective cover 90 (Sample B) exhibited much better surface properties than the sample that was without a cover 90

(Sample A). The wipeability of this sample improved substantially from a 3–4 rating to a very desirable rating of 1, indicating a very easy to clean surface. As was the case above, the vinegar wash had no apparent effect on the wipeability of the sample that had been without a cover 90 (Sample A), as this sample had an unimproved wipeability rating of 3–4 even after the vinegar wash. Moreover, the contact angle of the sample that carried a cover 90 was reduced to 15° and 14°, which is less than half that which was found on some areas of the sample that was without a protective cover 90.

These results further support the effectiveness of the present cover 90 in protecting hydrophilic surfaces against contamination. Moreover, they indicate how surprisingly easily glass surfaces can become contaminated, as these samples were merely exposed to air blown by a fan in a typical glass processing facility.

EXAMPLE 3

A deposit of silicone grease was applied to a central area of each glass sheet of Sample A and Sample B. After about six hours, the silicone grease deposits were substantially removed by wiping the glass with clean paper towels. Both samples were then tested for contamination in the same manner as in Examples 1 and 2. The results of these tests were as follow:

TABLE 3

| Sample | Surface | Contact Angle Following Exposure | Wipeability Following Exposure | Contact Angle After Vinegar Wash | Wipeability After Vinegar Wash |
|---|---|---|---|---|---|
| A | without Cover | 27°–105° | 2–3 | 23°–96° | 1–3 |
| B | with Cover | 78°–105° | 3 | 12° | 1 |

Following this direct exposure to silicone grease, both samples exhibited contact angles that were well beyond those which would be expected for such surfaces in an uncontaminated state. The contact angles of both samples varied according to the particular areas of each coated surface on which measurements were taken. Higher contact angles were typically found near the central areas of both sheets (i.e., where the silicone grease was deposited), while lower contact angles were commonly found near the margins of the sheets (i.e., outside the area of direct application of the silicone). The contact angles in the central areas of both samples were about 105 degrees, which indicates that these areas had become badly contaminated. The wipeability ratings of both samples were also less than ideal, particularly in the central areas of the glass where the wipeability for both samples was a mediocre 3.

After both samples were subjected to the vinegar wash, the hydrophilic coating that was protected by a cover 90 (Sample B) exhibited very desirable surface properties. The wipeability of this sample improved from an unimpressive rating of 3 to a much better rating of 1, indicating that this surface had become very easy to clean. Moreover, after the vinegar wash, the contact angle of this sample was reduced from a very hydrophobic 105 degrees in some areas to a desirably hydrophilic 12 degrees across the entire surface.

On the other hand, the vinegar wash was less successful for the hydrophilic coating that was without a cover 90 (Sample A). The wipeability of this sample had a rating of 2–3 before it was washed. While the vinegar wash did improve the wipeability of this sample in some areas, the central areas of the glass still exhibited a mediocre rating of 3. Similarly, while the contact angle range for this sample was reduced slightly, the central areas of the glass still had contact angles of about 96 degrees, which is undesirably hydrophobic.

These results indicate that the present cover 90 are effective in protecting glass surfaces against contamination even when a very difficult-to-remove silicone contaminant is applied directly to the covered glass.

EXAMPLE 4

An experimental sample, designated Sample C, comprising a sheet of glass bearing a hydrophilic coating was compared with another experimental sample, designated Sample D, comprising a sheet of glass bearing the same hydrophilic coating as in Sample C and carrying a protective cover 90 over this hydrophilic coating.

The glass sheets of Sample C were produced in the following manner. A clean surface of a sheet of soda-lime glass was sputter coated with silicon dioxide in an oxidizing atmosphere comprising 80% oxygen and 20% argon. Three rotary targets comprising about 95% silicon and about 5% aluminum were operated at a power level of about 117 kW with the glass moving at a rate of about 300 inches per minute. The resulting silicon dioxide coating had a thickness of about 60 angstroms.

The glass sheets of Sample D were produced in the following manner. A plain sheet of soda-lime glass was sputter coated with silicon dioxide in the same manner as in Sample C. Thereafter, a temporary protective cover 90 of the invention comprising zinc oxide was sputtered onto the silicon dioxide coating. The zinc oxide was sputtered in an oxidizing atmosphere comprising 100% oxygen. A planar zinc target was operated at a power level of about 13 kW with the glass moving at a rate of about 300 inches per minute. The resulting zinc oxide covers had a thickness of about 20 angstroms.

Prior to any environmental exposure, glass sheets of Sample C and Sample D were tested for wipeability and contact angle in the same manner as in Examples 1–3. The results of these tests were as follow:

TABLE 4A

| Sample | Surface | Contact Angle | Wipeability |
|---|---|---|---|
| C | without Cover | 18° | 1–2 |
| D | with Cover | 17°–20° | 1 |

A number of sealed insulating glass units were then assembled using glass sheets of Sample C. Likewise, insulating glass units were assembled using glass sheets of Sample D. A deposit of uncured silicone sealant was placed upon the pane of each unit opposite the pane bearing the hydrophilic coating. The units were then stacked vertically on a conventional glass rack in a research laboratory for a period of days.

A first group of units, including Sample C units and Sample D units, was tested for contact angle and wipeability after a period of three days. The results of these tests were as follow:

TABLE 4B

FIRST GROUP (UNITS EXPOSED FOR THREE DAYS)

| Sample | Surface | Contact Angle Following Exposure | Wipeability Following Exposure | Contact Angle After Vinegar Wash | Wipeability After Vinegar Wash |
|---|---|---|---|---|---|
| C | without Cover | 60° | 4 | 52° | 4 |
| D | with Cover | 70° | 4 | 10° | 1 |

Following three days of exposure, the surface properties of both samples were substantially less desirable than they were prior to exposure. The contact angles of both samples were more than three times those of the glass prior to exposure. Moreover, the wipeability of Samples C and D changed from ratings of 1–2 and 1, respectively, to an undesirable rating of 4 for both samples.

After the vinegar wash, however, the surface properties of the glass that originally carried a cover 90 were greatly improved. The contact angle of this sample (Sample D) dropped dramatically from 70 degrees to 10 degrees. The wipeability of this sample also greatly improved from a rating of 4 to a rating of 1, indicating that this sample had become very easy to clean.

The vinegar wash did not have the same effects on the surface properties of the sample that was without a cover 90 (Sample C). While the contact angle of this sample decreased slightly, it was still 52 degrees following the vinegar wash, which would normally be higher than is preferred for a hydrophilic coating. Furthermore, the vinegar wash had no apparent effect on the wipeability of this sample, as it retained an undesirable rating of 4 even after washing.

A second group of units, including Sample C units and Sample D units, was tested for wipeability after a period of five days, while a third group was tested after 19 days. The results of these tests were as follow:

TABLE 4C

| Sample | Surface | SECOND GROUP (UNITS EXPOSED FOR FIVE DAYS) Wipeability Following Exposure | Wipeability After Vinegar Wash | Sample | Surface | THIRD GROUP (UNITS EXPOSED FOR 19 DAYS) Wipeability Following Exposure | Wipeability After Vinegar Wash |
|---|---|---|---|---|---|---|---|
| C | without Cover | 4 | 4 | C | without Cover | 4 | 4 |
| D | with Cover | 2–3 | 1 | D | with Cover | 4 | 1 |

Following both periods of exposure, the wipeability ratings of all of the samples were less desirable than they were prior to exposure, indicating that the samples had all become contaminated. After the vinegar wash, the wipeability of each sample that originally carried a cover 90 was substantially improved. For example, the wipeability of the third group of Sample D glass improved dramatically from a 4 rating to a very desirable rating of 1. Conversely, the vinegar wash had no apparent effect on the wipeability of any of the samples that had been without a cover 90.

These results indicate that the present cover 90 are effective in protecting glass surfaces against contamination even throughout prolonged periods of exposure. Further, the cumulative results of Experimental Examples 1–4 indicate that the present protective covers 90 are effective in protecting glass against contamination even at thicknesses on the order of 16–20 angstroms. As discussed below, however, it has been found that the present cover 90 desirably have thicknesses of at least about 25 angstroms when such cover 90 are destined to be subjected to glass tempering.

EXAMPLE 5

To assess the effectiveness of the present covers 90 in protecting tempered glass against contamination at different thicknesses, the following comparative samples were prepared.

TABLE 5A

| Sample | Surface |
|---|---|
| E | 50 angstroms $SiO_2$, not carrying a cover |
| F | 50 angstroms $SiO_2$, carrying cover having thickness of 10 angstroms |
| G | 50 angstroms $SiO_2$, carrying cover having thickness of 20 angstroms |
| H | 50 angstroms $SiO_2$, carrying cover having thickness of 30 angstroms |
| I | 50 angstroms $SiO_2$, carrying cover having thickness of 40 angstroms |
| J | 35 angstroms $SiO_2$, not carrying a cover |
| K | 35 angstroms $SiO_2$, carrying cover having thickness of 10 |

TABLE 5A-continued

| Sample | Surface |
|---|---|
|  | angstroms |
| L | 35 angstroms $SiO_2$, carrying cover having thickness of 20 angstroms |

TABLE 5A-continued

| Sample | Surface |
|---|---|
| M | 35 angstroms SiO$_2$, carrying cover having thickness of 30 angstroms |
| N | 35 angstroms SiO$_2$, carrying cover having thickness of 40 angstroms |

Sample E was produced in the following manner. A clean surface of a sheet of soda-lime glass was sputter coated with silicon dioxide. The silicon dioxide was sputtered in an oxidizing atmosphere comprising 80% oxygen and 20% argon. Two rotary targets comprising about 95% silicon and about 5% aluminum were operated at a power level of about 27 kW with the glass moving at a rate of about 260 inches per minute. The resulting silicon dioxide coating had a thickness of about 50 angstroms.

Samples F–I were produced in the following manner. A clean surface of a sheet of soda-lime glass was sputter coated with silicon dioxide in the same manner as in Sample E. Thereafter, a temporary protective cover 90 of the invention comprising zinc-tin oxide was sputtered onto the silicon dioxide coating. The zinc-tin oxide was sputtered in an oxidizing atmosphere comprising 80% oxygen and 20% argon. The zinc-tin oxide covers of Samples F–I were deposited by operating a planar zinc-tin target (e.g., zinc and less than 15% tin) at power levels of about 6.8 kW, 13.7 kW, 20.5 kW, and 27.3 kW, respectively. The resulting zinc-tin oxide covers of samples F–I had thicknesses of about 10 angstroms, 20 angstroms, 30 angstroms, and 40 angstroms, respectively.

Sample J was produced in much the same manner as Sample E. A clean surface of a sheet of soda-lime glass was sputter coated with the silicon dioxide. The silicon dioxide was sputtered in an oxidizing atmosphere comprising 80% oxygen and 20% argon. Two rotary targets comprising about 95% silicon and about 5% aluminum were operated at a power level of about 27 kW with the glass moving at a rate of about 370 inches per minute. The resulting silicon dioxide coating had a thickness of about 35 angstroms.

Samples K–N were produced in the following manner. A clean surface of a sheet of soda-lime glass was sputter coated with the silicon dioxide coating of Sample J. A temporary protective cover 90 of the invention comprising zinc-tin oxide was then sputtered onto the silicon dioxide coating. The zinc-tin oxide was sputtered from a planar zinc-tin target (e.g., zinc and less than 15% tin) in an oxidizing atmosphere comprising 80% oxygen and 20 argon. The zinc-tin oxide covers of Samples K-N were deposited by operating the target at power levels of about 9.7 kW, 20 kW, 30 kW, and 40 kW, respectively. The resulting zinc-tin oxide covers of samples K–N had thicknesses of about 10 angstroms, 20 angstroms, 30 angstroms, and 40 angstroms, respectively.

Glass sheets from all ten samples were then subjected to conventional glass tempering temperatures (e.g., on the order of about 600° C.). Following tempering, each sample was measured for wipeability. A deposit of uncured silicone sealant was then applied directly to a central area of each glass sheet. The silicone deposits were left on the samples for a period of 3 days, after which the deposits were substantially removed by wiping the glass with towels. After this exposure, the wipeability of each sample was once again measured. Finally, a vinegar wash was performed on each sample whereafter the samples were once again tested for the wipeability. The results of these measurements were as follow:

TABLE 5B

| Sample ID | Cover Thickness | Wipeability Before Exposure | Wipeability Following Exposure | Wipeability Following Vinegar Wash |
|---|---|---|---|---|
| E | no cover | 1 | 4 | 3 |
| F | 10 angstroms | 1 | 4 | 1 and 3 |
| G | 20 angstroms | 1 | 4 | 1 and 3 |
| H | 30 angstroms | 1 | 4 | 1 |
| I | 40 angstroms | 1 | 4 | 1 |
| J | no cover | 1 | 4 | 4 |
| K | 10 angstroms | 1 | 4 | 3–4 |
| L | 20 angstroms | 1 | 4 | 2 |
| M | 30 angstroms | 1 | 4 | 1 |
| N | 40 angstroms | 1 | 4 | 1 |

Following exposure, the wipeability of all ten samples had decreased from a rating of 1 to an undesirable rating of 4. As expected, the vinegar wash had little effect on the wipeability of the samples that were without a cover 90 (Samples E and J). Moreover, the vinegar wash was less effective on Samples F, G, K, and L. Each of these samples originally carried a cover 90 with a thickness of either 10 or 20 angstroms. For example, following the vinegar wash, Samples F and G were left with local surface areas that exhibited a mediocre wipeability rating of 3. Likewise, Sample K (10 angstrom cover) had an undesirable 3–4 wipeability rating after the vinegar wash, while Sample L (20 angstrom cover) was left with a wipeability rating of 2. In comparison, each of the samples with a 30 or 40 angstrom cover exhibited a uniform wipeability rating of 1 following the vinegar wash.

These results suggest that the 10 and 20 angstrom cover 90 were negatively impacted by tempering. This may have been the result of the oxide cover recrystallizing, and perhaps changing in density and becoming significantly porous. Thus, it is believed to be desirable to employ a protective cover 90 having a thickness of at least about 25 angstroms when the cover 90 is intended to endure glass tempering procedures.

While a preferred embodiment of the present invention has been described, it should be understood that various changes, adaptations and modifications may be made therein without departing from the spirit of the invention and the scope of the appended claims.

What is claimed is:

1. A window assembly comprising:
   a) a window pane having an exterior surface that is durable to a selected washing fluid, the exterior surface carrying a temporary protective cover comprising a sputtered film that can readily be removed by washing with the selected washing fluid, the temporary protective cover being durable to glass tempering, wherein the window pane has an interior surface carrying a low-emissivity coating; and
   b) a window frame to which the pane is secured by a bead of sealant, the bead of sealant being bonded on a first side directly to a peripheral portion of the protective cover, said peripheral portion of the cover overlying a peripheral region of the pane's exterior surface, the bead of sealant being bonded on a second side to the window frame.

2. The window assembly of claim 1 wherein cover has been removed from a central portion of the pane's exterior surface.

3. A sheet-like substrate having two generally-opposed major surfaces, one of the major surfaces being an interior surface, the other major surface being an exterior surface, wherein the interior surface carries a low-emissivity coating and the exterior surface carries a temporary protective cover that protects the exterior surface against contamination, the temporary protective cover being stable in the presence of water and being durable to glass tempering but breaking down in the presence of a mild acid or a mild base.

4. The substrate of claim 3, wherein the cover is formed of inorganic material.

5. The substrate of claim 3, wherein the cover has a thickness of less than about 100 Å.

6. The substrate of claim 5, wherein the cover has a thickness of at least about 25 Å.

7. The substrate of claim 3, wherein the substrate is installed in a position wherein said covered exterior surface is exposed to an outdoor environment.

8. The substrate of claim 3, wherein the substrate is part of a multiple-pane insulating glass unit having confronting surfaces that bound a between-pane space, wherein said interior surface carrying the low-emissivity coating is one of the confronting surfaces of the insulating glass unit, and wherein said exterior surface carrying the temporary protective cover is oriented away from the between-pane space of the insulating glass unit.

9. The substrate of claim 3, wherein the cover is formed of a sputtered metal oxide selected from the group consisting of zinc oxide, bismuth oxide, cadmium oxide, iron oxide, and nickel oxide.

10. The substrate of claim 3, wherein the cover comprises zinc oxide.

11. The substrate of claim 3, wherein said exterior surface is formed by the substrate itself.

12. The substrate of claim 3, wherein said exterior surface is formed by a durable coating on the substrate.

13. The substrate of claim 3, wherein the cover has at thickness of between about 25 Å and about 60 Å.

14. The substrate of claim 3, wherein the cover breaks down in the presence of vinegar.

15. The substrate of claim 3, wherein the low-emissivity coating comprises, moving outwardly from the substrate, at least one dielectric layer, a metal layer, and a further dielectric layer.

16. The substrate of claim 15, wherein the metal layer comprises silver.

17. A sheet-like substrate having two generally-opposed major surfaces, one of the major surfaces being an interior surface, the other major surface being an exterior surface, wherein the interior surface carries a low-emissivity coating and the exterior surface carries a temporary protective cover that protects the exterior surface against contamination, the temporary protective cover being stable in the presence of water and durable to glass tempering but breaking down in the presence of a mild acid or a mild base, and wherein the temporary protective cover is formed of an inorganic material.

18. A sheet-like substrate having two generally-opposed major surfaces, one of the major surfaces being an interior surface, the other major surface being an exterior surface, wherein the interior surface carries a low-emissivity coating and the exterior surface carries a temporary protective cover that protects the exterior surface against contamination, the temporary protective cover being stable in the presence of water and durable to glass tempering but breaking down in the presence of a mild acid or a mild base and wherein the temporary protective cover has a thickness of at least about 25 Å but less than about 100 Å.

19. A sheet-like substrate having two generally-opposed major surfaces, one of the major surfaces being an interior surface, the other major surface being an exterior surface, wherein the interior surface carries a low-emissivity coating and the exterior surface carries a temporary protective cover that protects the exterior surface against contamination, the temporary protective cover being stable in the presence of water and durable to glass tempering but breaking down in the presence of a mild acid or a mild base, and wherein the temporary protective cover is formed of a sputtered metal oxide selected from the group consisting of zinc oxide, bismuth oxide, cadmium oxide, iron oxide, and nickel oxide.

20. A sheet-like substrate having two generally-opposed major surfaces, one of the major surfaces being an interior surface, the other major surface being an exterior surface, wherein the interior surface carries a low-emissivity coating comprising, moving outwardly from the substrate, at least one dielectric layer, a metal layer, and a further dielectric layer, and wherein the exterior surface carries a temporary protective cover that protects the exterior surface against contamination, the temporary protective cover being durable to glass tempering and having a thickness of at least about 25 Å but less than about 100 Å and being formed of a sputtered metal oxide selected from the group consisting of zinc oxide, bismuth oxide, cadmium oxide, iron oxide, and nickel oxide.

21. A sheet-like substrate having two generally-opposed major surfaces, one of the major surfaces being an interior surface, the other major surface being an exterior surface, wherein the interior surface carries a low-emissivity coating, wherein the exterior surface carries a temporary protective cover that protects the exterior surface against contamination, the temporary protective cover being durable to glass tempering and having a thickness of at least about 25 Å but less than about 100 Å and being formed of a sputtered metal oxide selected from the group consisting of zinc oxide, bismuth oxide, cadmium oxide, iron oxide, and nickel oxide, wherein the substrate is part of a multiple-pane insulating glass unit having confronting surfaces that bound and are oriented toward a between-pane space, and wherein said exterior surface carrying the temporary protective cover is oriented away from said between-pane space.

22. A sheet-like substrate having two generally-opposed major surfaces, one of the major surfaces being an interior surface, the other major surface being an exterior surface, wherein the interior surface carries a low-emissivity coating and the exterior surface bears a hydrophilic coating carrying a temporary protective cover that protects the hydrophilic coating against contamination, the temporary protective cover being stable in the presence of water and durable to glass tempering but breaking down in the presence of a mild acid or a mild base, and wherein the temporary protective cover has a thickness of at least about 25 Å but less than about 100 Å and comprises a metal oxide selected from the group consisting of zinc oxide, bismuth oxide, cadmium oxide, iron oxide, and nickel oxide.

* * * * *